(12) United States Patent
Kanda et al.

(10) Patent No.: US 7,947,156 B2
(45) Date of Patent: May 24, 2011

(54) SUBSTRATE PROCESSING APPARATUS AND SUBSTRATE PROCESSING METHOD

(75) Inventors: Hiroyuki Kanda, Tokyo (JP); Akira Susaki, Tokyo (JP); Satoru Yamamoto, Tokyo (JP); Tsutomu Nakada, Tokyo (JP)

(73) Assignee: Ebara Corporation, Tokyo (JP)

( * ) Notice: Subject to any disclaimer, the term of this patent is extended or adjusted under 35 U.S.C. 154(b) by 843 days.

(21) Appl. No.: 11/907,187

(22) Filed: Oct. 10, 2007

(65) Prior Publication Data

US 2008/0099340 A1 May 1, 2008

(30) Foreign Application Priority Data

Oct. 12, 2006 (JP) ................................. 2006-279240

(51) Int. Cl.
*C25D 17/00* (2006.01)
(52) U.S. Cl. ........................................ 204/198; 204/232
(58) Field of Classification Search .................. 204/198, 204/232, 267; 205/219
See application file for complete search history.

(56) References Cited

U.S. PATENT DOCUMENTS

| | | | | |
|---|---|---|---|---|
| 6,033,540 | A * | 3/2000 | Kosaki et al. ................. | 204/284 |
| 6,632,335 | B2 * | 10/2003 | Matsuda et al. ........... | 204/230.2 |
| 6,746,589 | B2 * | 6/2004 | Mishima et al. ................. | 205/98 |
| 7,135,404 | B2 * | 11/2006 | Baskaran et al. .............. | 438/652 |
| 2001/0035355 | A1 * | 11/2001 | Kamijima ...................... | 205/118 |
| 2004/0069647 | A1 * | 4/2004 | Mizohata et al. .............. | 205/101 |
| 2004/0069648 | A1 | 4/2004 | Andricacos et al. | |
| 2005/0274622 | A1 * | 12/2005 | Sun et al. ....................... | 205/209 |

OTHER PUBLICATIONS

Moffat et al., "Electrodeposition of Cu on Ru Barrier Layers for Damascene Processing", *Journal of The Electrochemical Society*, vol. 153, No. 1, pp. C37-C50, 2006.

\* cited by examiner

*Primary Examiner* — Luan V Van
(74) *Attorney, Agent, or Firm* — Wenderoth, Lind & Ponack, L.L.P.

(57) ABSTRACT

A substrate processing apparatus can carry out removal of a passive layer (ruthenium oxide) present on a surface of a ruthenium film and electroplating successively, and can reduce the terminal effect at the time of the removal of the passive layer (ruthenium oxide) from the ruthenium film. The substrate processing apparatus includes: an electrolytic processing apparatus for electrochemically removing a passive layer, formed on a surface of a ruthenium film on a substrate, by electrolytic processing with the ruthenium film as a cathode; a copper electroplating apparatus for carrying out copper electroplating on the surface of the ruthenium film on the substrate; and an apparatus frame housing the electrolytic processing apparatus and the copper electroplating apparatus.

17 Claims, 24 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and more particularly to a substrate processing apparatus and a substrate processing method which are useful for carrying out copper plating on a surface of a ruthenium film, for example, having a thickness of not more than 10 nm, formed in a surface of a substrate, such as a semiconductor wafer, thereby forming LSI interconnects of copper.

2. Description of the Related Art

When copper is used, instead of aluminum, as a material for LSI interconnects, copper plating is generally employed as a method for forming the interconnects.

FIGS. 1A through 1C illustrate, in a sequence of process steps, a process for producing a substrate having such copper interconnects. First, as shown in FIG. 1A, an insulating film 2 of, for example, an oxide film of $SiO_2$ or a film of low-k material, is deposited on a conductive layer 1a, in which semiconductor devices are formed, on a semiconductor base 1, and via holes 3 and trenches 4 as interconnect recesses are formed in the insulating film 2 by the lithography/etching technique. Thereafter, a barrier layer 5 is formed on the entire surface and then a seed layer 7, which serves as a feeding layer in electrolytic plating, is formed on the barrier layer 5. A metal such as tantalum, titanium, tungsten or ruthenium, or a nitride thereof is generally used for the barrier layer 5.

Next, copper plating is carried out onto a surface of the seed layer 7 of the substrate W to fill copper into the via holes 3 and the trenches 4 while depositing a copper film 6 on the insulating film 2, as shown in FIG. 1B. Thereafter, the copper film 6, the seed layer 7 and the barrier layer 5 on the insulating film 2 are removed by chemical mechanical polishing (CMP) so as to make the surface of the copper film 6, filled in the via holes 3 and the trenches 4, substantially flush with the surface of the insulating film 2. Interconnects composed of the copper film 6, as shown in FIG. 1C, are thus formed in the insulating film 2.

In conventional copper plating processes, a copper seed layer, formed by sputtering, CVD, ALD, electroless plating, or the like, has been widely used as the seed layer 7. With the progress toward finer interconnects, such a copper seed layer is becoming increasingly thinner year by year.

In particular, a thickness of a copper seed layer in the field region of a substrate is around 600 angstroms in the manufacturing of the 65-nm generation of semiconductor devices. The thickness of copper seed layer is expected to be not more than 500 angstroms in the 45-nm generation of semiconductor devices, and not more than 300 angstroms in the 32-nm or later generation of semiconductor devices. The side coverage of a copper seed layer, as formed by the most-prevalent sputtering method, is generally 10 to 15%. Therefore, a copper seed layer used in the manufacturing of the 32-nm or later generation of semiconductor devices will have a very small thickness on the order of several tens of angstrom in its portions formed on the side walls of via holes or trenches. The continuity as a seed layer will thus be lost and the function will be insufficient, leading to significantly poorer filling of copper into the recesses. There is therefore a movement to use, instead of sputtering, a more conformal film-forming method, such as CVD or ALD, to form a copper seed layer.

On the other hand, there is an attempt to eliminate a copper seed layer and carry out copper plating directly on a surface of a barrier layer of ruthenium. This is partly because of the instability of a copper material in an atmospheric environment. Thus, copper is easily oxidized in the air, forming a natural oxide film (copper oxide), having a thickness of several angstroms to several tens of angstroms, on a surface of a copper seed layer. Copper oxide is not electrically conductive and is easily soluble in an acidic plating solution.

When copper plating is carried out directly onto a surface of a barrier layer, there is a case, depending on the material of the barrier layer, in which a copper plated film with good morphology as formed by electroless copper plating on a copper seed layer, cannot be obtained or a case in which the plated copper film has poor adhesion to the barrier layer. Further, with the progress toward direct plating on a barrier layer, a thickness of a barrier layer will become several tens of angstroms and the sheet resistance of a barrier layer will become several tens of $\Omega/\square$, thus making the terminal effect of a barrier layer more problematic than that of a copper seed layer.

A technique for direct plating onto a barrier layer has been proposed which involves adjusting deposition potentials of barrier layer/copper and copper/copper using a copper sulfate plating solution containing additives, and gradually increasing the electric current applied, thereby filling copper into interconnect recesses covered with a barrier layer (see, for example, US Patent Publication No. 2004/0069648 and U.S. Pat. No. 6,974,531). Though this technique enables uniform filling of copper into interconnect trenches covered with a barrier layer, a thickness of a copper plated film after plating, formed on a substrate, differs between the center and the edge of the film especially when the substrate is a 300-mm wafer, which may cause a problem in a later CMP process.

When there is a passive layer (ruthenium oxide) formed on a surface of a ruthenium film as a barrier layer, copper will be deposited in a particulate form upon direct copper plating of the surface of the ruthenium film (barrier layer), which can cause voids in a fine interconnect pattern and surface roughness of the plated film on the wafer. There is a report that for such a wafer, it is effective to carry out pretreatment (electrolytic processing), prior to copper plating, by using a mixed solution of 1.8 mol/L (17.6 wt %) of sulfuric acid and 1 mmol/L of NaCl as a pretreatment solution (electrolytic solution) and applying a voltage with a ruthenium film as a cathode (see, for example, T. P. Moffat et al., "Electrodeposition of Cu on Ru Barrier Layers for Damascene Processing", journal of the Electrochemical Society, 153 (1) C37-C50 (2006)). This pretreatment solution (electrolytic solution), because of sodium contained therein, is generally difficult to use in a semiconductor manufacturing process. Further, the 1.8 mol/L (17.6 wt %) sulfuric acid is a dangerous chemical and requires careful handling. The NaCl in this pretreatment solution (electrolytic solution) is considered to act merely as a supporting electrolyte, and the pretreatment solution (electrolysis system) has a considerably high electric conductivity of about 0.6/$\Omega$·cm, as shown in FIG. 6.

SUMMARY OF THE INVENTION

When carrying out copper plating directly onto a surface of a ruthenium film as a barrier layer, it is necessary to remove a passive layer (ruthenium oxide) present on the surface of the ruthenium film prior to copper plating. Particularly, as a thickness of a ruthenium film becomes smaller, the proportion of oxide film (ruthenium oxide) in the ruthenium film becomes larger. In view of this, and also in order to carry out stable plating without depending on Q time (queuing time until start-up of plating apparatus), a passive layer (ruthenium oxide) on a surface of a ruthenium film needs to be removed.

If, however, a passive layer (ruthenium oxide) on a surface of a ruthenium film is removed prior to copper plating, an oxide film (ruthenium oxide) will newly grow on the surface of the ruthenium film during the period until the initiation of copper plating. In addition, the sheet resistance of ruthenium film is expected to become several tens of $\Omega/\square$ to several hundred $\Omega/\square$. It therefore becomes necessary to reduce the terminal effect when removing a passive film (ruthenium oxide) present on a surface of a ruthenium film.

The present invention has been made in view of the above situation. It is therefore an object of the present invention to provide a substrate processing apparatus and a substrate processing method which can carry out removal of a passive layer (ruthenium oxide) present on a surface of a ruthenium film and electroplating successively, and can reduce the terminal effect at the time of the removal of the passive layer (ruthenium oxide) from the ruthenium film.

In order to achieve the object, the present invention provides a substrate processing apparatus comprising: an electrolytic processing apparatus for electrochemically removing a passive layer, formed on a surface of a ruthenium film on a substrate, by electrolytic processing with the ruthenium film as a cathode; a copper electroplating apparatus for carrying out copper electroplating on the surface of the ruthenium film on the substrate; and an apparatus frame housing the electrolytic processing apparatus and the electrolytic copper plating apparatus.

The substrate processing apparatus makes it possible to carry out, in a successive one-by-one manner, copper electroplating of a substrate shortly after carrying out electrolytic processing of the substrate to electrochemically remove a passive layer formed on a surface of a ruthenium film, e.g., having a thickness of not more than 10 nm. This can prevent an oxide film (ruthenium oxide) from growing on the surface of the ruthenium film during the period after the removal of the passive layer until the initiation of copper plating. Furthermore, it becomes possible to control the time period after the removal of the passive layer until the initiation of copper plating at a constant time.

Preferably, the electrolytic processing apparatus and the copper electroplating apparatus include a substrate processing section having a common substrate stage for rotatably and vertically-movably holding the substrate with its front surface facing upwardly.

This makes it possible to carry out electrolytic processing by the electrolytic processing apparatus and copper electroplating by the copper electroplating apparatus successively while holding the substrate with the substrate stage, thereby further shortening the time period after the removal of the passive layer until the initiation of copper plating.

The electrolytic processing apparatus may use, for example, sulfuric acid having a concentration of not more than 10 wt % (about 1.0 mol/L) as an electrolytic solution.

The electric conductivity of sulfuric acid having a concentration of not more than 10 wt % (about 1.0 mol/L) is about 0.4/$\Omega$·cm. The use of an electrolytic solution having such a low electric conductivity, which makes passage of electric current through the solution harder, can reduce, from the side of electrolytic solution, the influence of the terminal effect at the time of removal of a passive layer (ruthenium oxide) having a high sheet resistance, formed on a surface of a ruthenium film, and can realize freedom from Na in electrolytic solution. Further, the use as an electrolytic solution of sulfuric acid having a concentration of not more than 10 wt %, which is not within the category of dangerous chemicals, can facilitate the handling of the solution (sulfuric acid) and prevent a change in the composition of a copper sulfate plating solution during copper electroplating carried out using the copper electroplating solution. The concentration of sulfuric acid for use as an electrolytic solution is generally 0.01 to 10 wt % because when the pH of the solution is high, copper ions present as an impurity in a cell become cuprous hydroxide or the like which precipitates in the form of particles. Also in view of possible precipitation of Fe or other heavy metal, the concentration of sulfuric acid as an electrolytic solution is preferably 1 to 10 wt %.

Alternatively, the electrolytic processing apparatus may use as an electrolytic solution a Na-free acidic aqueous solution having an electric conductivity of not more than 0.4/$\Omega$·cm.

This also can reduce, from the side of electrolytic solution, the influence of the terminal effect at the time of removal of a passive layer (ruthenium oxide) present in the surface of a ruthenium film, and can realize freedom from Na in electrolytic solution. Because of the above-stated reasons, the electric conductivity of the electrolytic solution is generally 0.001 to 0.4/$\Omega$·cm, and preferably 0.05 to 0.4/$\Omega$·cm.

In a preferred aspect of the present invention, the electrolytic solution contains at least one of HCl, $H_3PO_4$, $HNO_3$, HF and KCl.

The electrolytic processing apparatus preferably includes an insoluble anode.

The use of an insoluble anode not soluble in an electrolytic solution, which anode makes its replacement unnecessary, is preferably used in electrolytic processing.

The area of the insoluble anode may be set to be smaller than the area of the substrate. The insoluble anode is preferably designed to be movable relative and parallel to the substrate.

This makes it possible to carry out electrolytic processing in such a manner that electrolytic processing of part of the substrate is shifted to cover the entire substrate surface, thereby reducing, from the side of apparatus, the influence of the terminal effect at the time of removal of a passive layer (ruthenium oxide) present on a surface of a ruthenium film.

The present invention also provides an electrolytic processing apparatus adapted for electrochemically removing a passive layer, formed on a surface of a ruthenium film on a substrate, by electrolytic processing with the ruthenium film as a cathode using sulfuric acid having a concentration of not more than 10 wt % as an electrolytic solution.

The present invention also provides another electrolytic processing apparatus adapted for electrochemically removing a passive layer, formed on a surface of a ruthenium film on a substrate, by electrolytic processing with the ruthenium film as a cathode using a Na-free acidic aqueous solution having an electric conductivity of not more than 0.4/$\Omega$·cm as an electrolytic solution.

The present invention also provides a substrate processing method comprising: providing a substrate having in a surface interconnect recesses covered with a ruthenium film; electrochemically removing a passive layer, formed on a surface of the ruthenium film, by electrolytic processing with the ruthenium film as a cathode using sulfuric acid having a concentration of not more than 10 wt % as an electrolytic solution; and forming a copper film by copper electroplating on the surface of the ruthenium film from which the passive film has been removed.

The present invention also provides another substrate processing method comprising: providing a substrate having in a surface interconnect recesses covered with a ruthenium film; electrochemically removing a passive layer, formed on a surface of the ruthenium film, by electrolytic processing with the ruthenium film as a cathode using a Na-free acidic aqueous solution having an electric conductivity of not more than 0.4/Ω·cm as an electrolytic solution; and forming a copper film by copper electroplating on the surface of the ruthenium film from which the passive film has been removed.

The time period after the electrochemical removal of the passive layer formed on a surface of the ruthenium film until the initiation of the copper electroplating is preferably within 5 minutes.

This has been confirmed to be capable of forming a plated film, having a uniform thickness all over the film and without an abnormal appearance, on the surface of a ruthenium film having a sheet resistance of, e.g., 80 Ω/□.

The present invention also provides an electrolytic processing method comprising electrochemically removing a passive layer, formed on a surface of a ruthenium film on a substrate, by electrolytic processing with the ruthenium film as a cathode using sulfuric acid having a concentration of not more than 10 wt % as an electrolytic solution.

The present invention also provides another electrolytic processing method comprising electrochemically removing a passive layer, formed on a surface of a ruthenium film on a substrate, by electrolytic processing with the ruthenium film as a cathode using a Na-free acidic aqueous solution having an electric conductivity of not more than 0.4/Ω·cm as an electrolytic solution.

DETAILED DESCRIPTION OF THE PREFERRED EMBODIMENTS

Figure 1A:
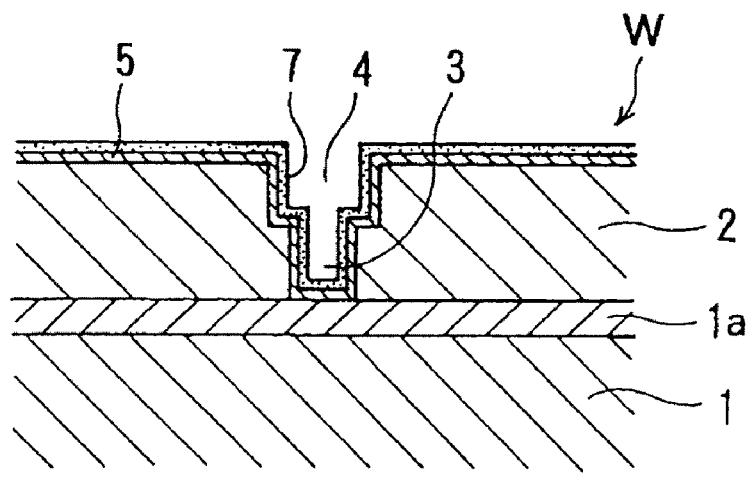
FIGS. 1A through 1C are diagrams illustrating, in a sequence of process steps, a process for the formation of copper interconnects.
Figure 1B:
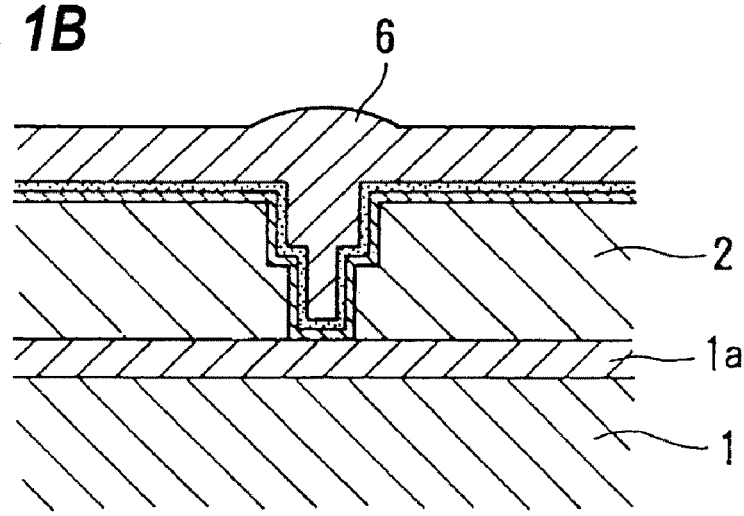
Figure 1C:
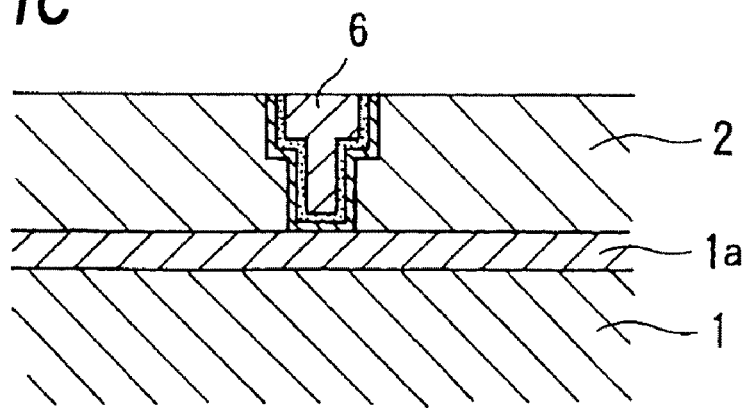

Preferred embodiments of the present invention will now be described with reference to the drawings. The following description illustrates the case of using a ruthenium film as the barrier layer 5 shown in FIG. 1A, and forming the copper film 6 shown in FIG. 1B on a surface of the seed layer (ruthenium film) 5 by carrying out copper electroplating directly thereon without forming the seed layer 7.

Figure 2:
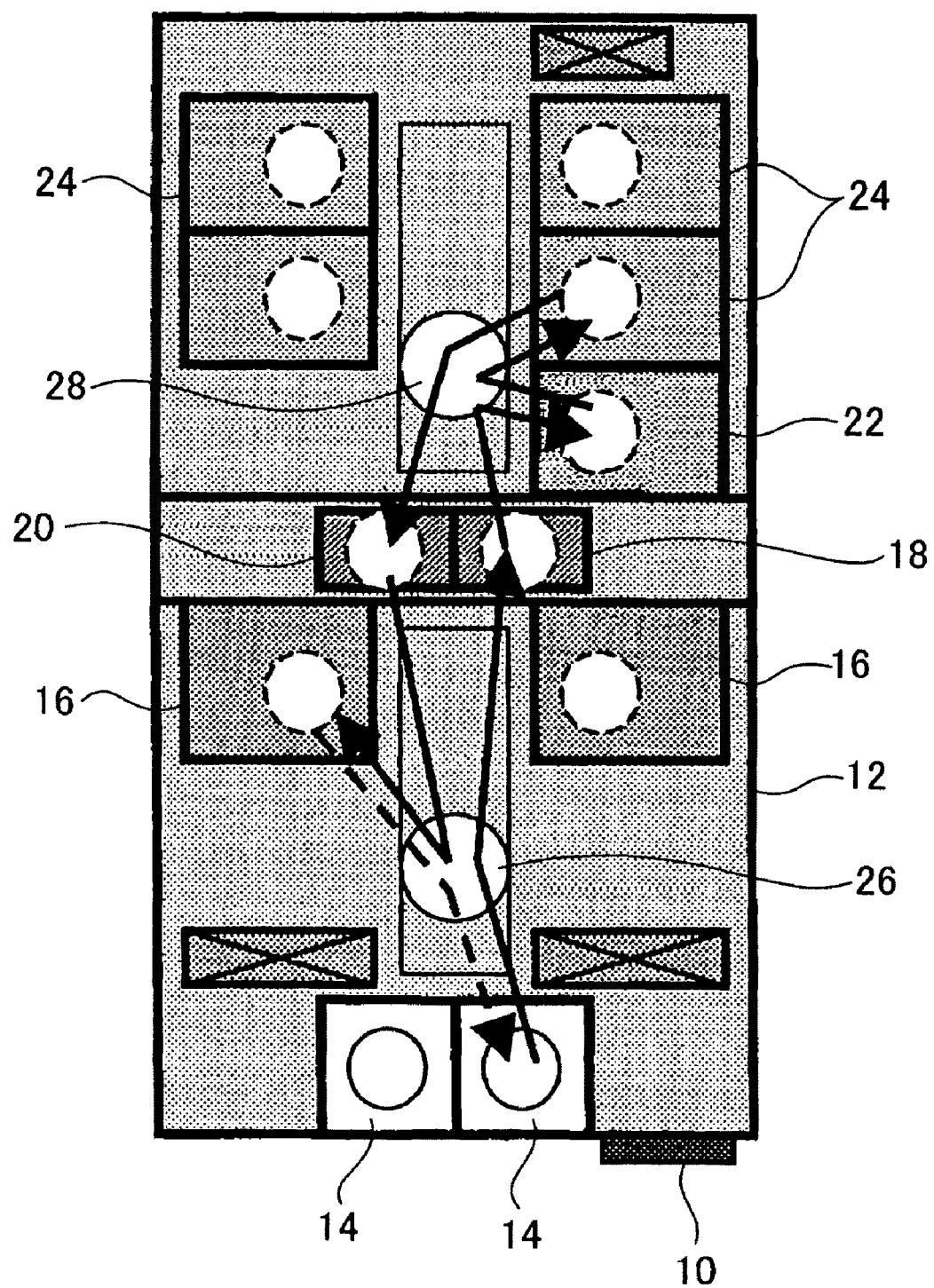
FIG. 2 is a layout plan view of a substrate processing apparatus according to an embodiment of the present invention.

FIG. 2 shows a layout plan view of a substrate processing apparatus according to an embodiment of the present invention. As shown in FIG. 2, the substrate processing apparatus includes a rectangular apparatus frame 12 having a control panel 10. In the apparatus frame 12 are disposed two loading/unloading sections 14 each for carrying in a substrate cassette housing a plurality of substrates, two bevel etching/back surface cleaning apparatuses 16, a substrate station 18, a rinsing/drying apparatus 20, one electrolytic processing apparatus 22 and four copper electroplating apparatuses 24. A first transport robot 26 is movably disposed between the loading/unloading sections 14, the bevel etching/back surface cleaning apparatuses 16, the substrate station 18 and the rinsing/drying apparatus 20, and a second transport robot 28 is movably disposed between the substrate station 18, the rinsing/drying apparatus 20, the electrolytic processing apparatus 22 and the copper electroplating apparatuses 24.

Figure 3:
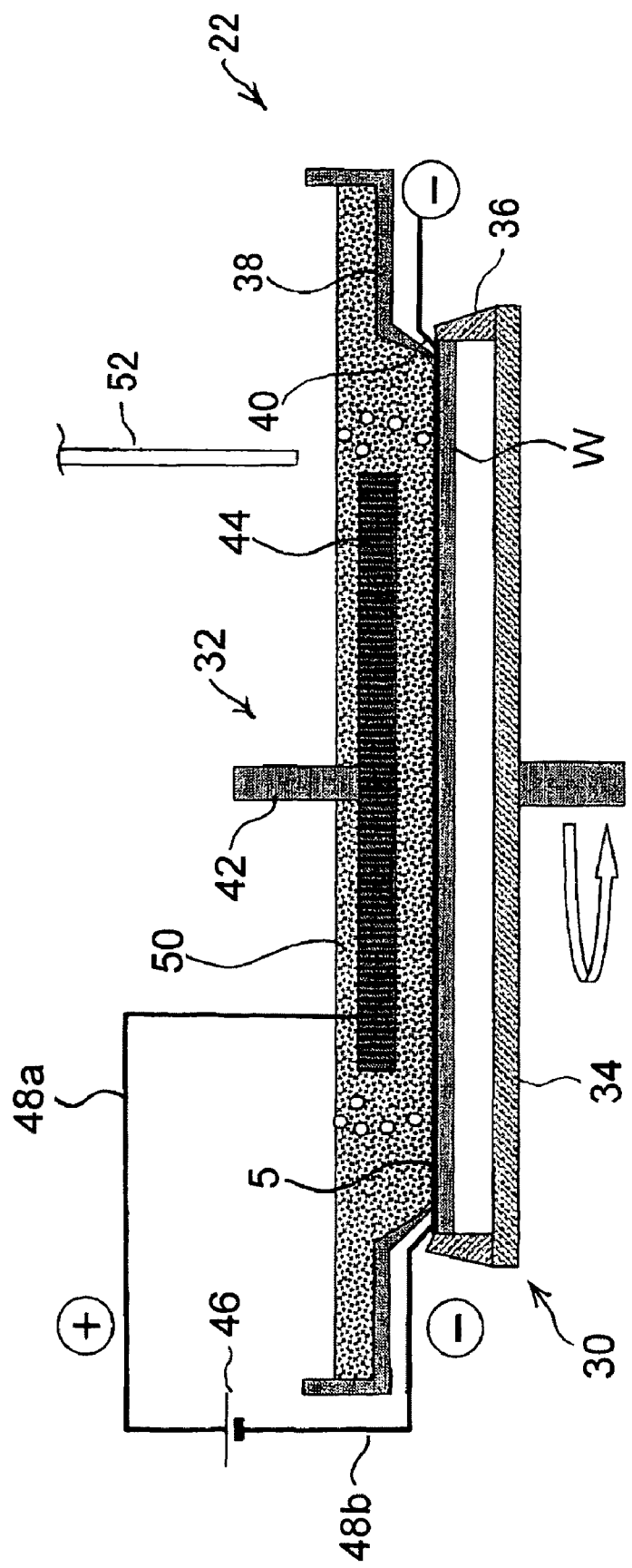
FIG. 3 is a schematic cross-sectional view of an electrolytic processing apparatus for use in the substrate processing apparatus shown in FIG. 2.

FIG. 3 shows a schematic view of the electrolytic processing apparatus 22. The electrolytic processing apparatus 22 is to electrochemically remove, prior to copper electroplating, a passive layer (ruthenium oxide) formed on the surface of the barrier layer 5 of ruthenium film, and is comprised mainly of a substrate processing section 30 and an electrolytic processing anode head 32. The substrate processing section 30 includes a substrate stage 34 for holding a substrate W with its front surface (with barrier layer formed) facing upwardly, and openable/closable substrate chucks 36, provided on the periphery of the upper surface of the substrate stage 34, for holding the edge of the substrate W. The substrate processing section 30 also includes a ring-shaped seal ring 38 which is located above the substrate stage 34 and which, when the substrate W held by the substrate stage 34 is raised, comes into pressure contact with a peripheral portion of the upper surface of the substrate W to seal the peripheral portion, and cathode contacts 40 for contact with the barrier layer 5 at such a peripheral portion of the upper surface of the substrate W that lies outside the contact portion of the substrate surface with the seal ring 38, to make the barrier layer 5 serve as a cathode. When the peripheral portion of the upper surface of the substrate W is sealed by the seal ring 38, an electrolytic solution chamber, circumferentially defined by the seal ring 38, is formed over the upper surface of the substrate W. Because the cathode contacts 40 are located outside the seal ring 38, contacts of the cathode contacts 40 with an electrolytic solution, held in the electrolytic solution chamber, can be avoided.

In this embodiment, the seal ring 38 and the cathode contacts 40, while keeping contact with the peripheral portions of the upper surface of the substrate W held by the substrate stage 34, rotate together with the substrate stage 34.

The electrolytic processing anode head 32 includes a vertically-movable lifting shaft 42, and a disk-shaped insoluble anode 44 coupled to the lower end of the lifting shaft 42 and facing the barrier layer 5 of the substrate W held by the substrate stage 34. The insoluble anode 44 is electrically connected to an anode conducting wire 48a extending from the anode of a power source 46, while the cathode contacts 40 are electrically connected to a cathode conducing wire 48b extending from the cathode of the power source 46. The insoluble anode 44, for example, composed of a titanium base and an iridium oxide coating, does not dissolve in an electrolytic solution during electrolytic processing, and thus is not subject to deformation. The use of the insoluble anode 44 can therefore render its replacement unnecessary.

Figure 6:
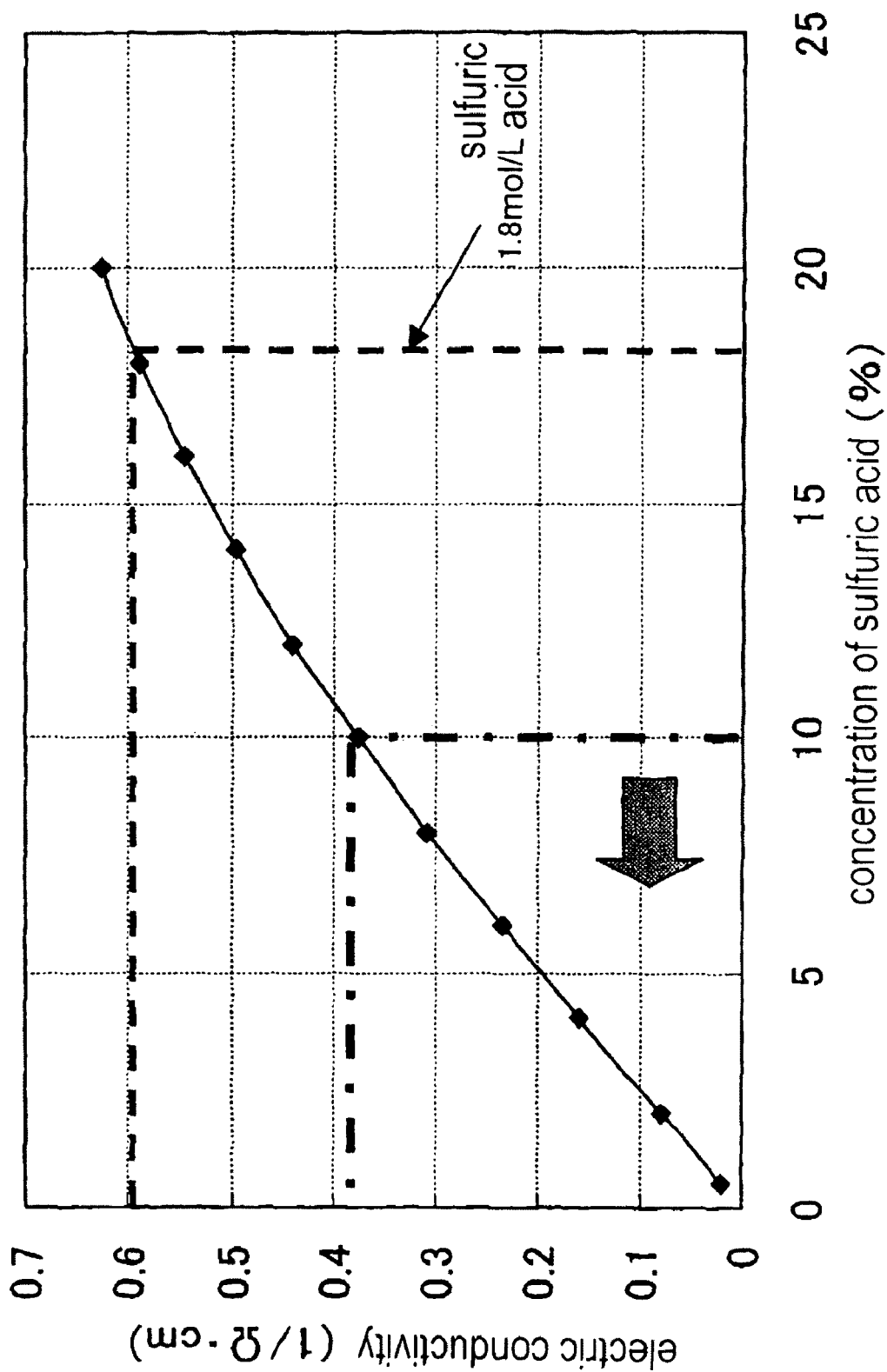
FIG. 6 is a graph showing the relationship between the concentration of sulfuric acid and the electric conductivity.

The substrate processing section 30 is provided with an electrolytic solution supply section 52, disposed above the substrate stage 34, for supplying an electrolytic solution 50 into the electrolytic solution chamber circumferentially defined by the seal ring 38 and formed over the upper surface of the substrate W. Sulfuric acid having a concentration of not more than 10 wt % (about 1.0 mol/L), particularly 8 wt % (about 0.8 mol/L) in this embodiment, is used as the electrolytic solution 50. The electric conductivity of sulfuric acid having a concentration of 10 wt % is about 0.4/Ω·cm, as shown in FIG. 6. The use of the electrolytic solution 50 having such a low electric conductivity, which makes passage of electric current through the solution harder, can reduce, from the side of the electrolytic solution 50, the influence of the terminal effect at the time of removal of a passive layer (ruthenium oxide) having a high sheet resistance, formed on the surface of the barrier layer 5 composed of a ruthenium film, and can realize freedom from Na in the electrolytic solution 50. Further, the use as the electrolytic solution 50 of sulfuric acid having a concentration of not more than 10 wt %, which is not within the category of a dangerous chemical, facilitates the handling of the solution and prevent a change in the composition of a copper sulfate plating solution during copper electroplating as carried out in the below-described manner using the copper electroplating solution. The concentration of sulfuric acid for use as the electrolytic solution 50 is generally 0.01 to 10 wt %, preferably 1 to 10 wt %.

Instead of sulfuric acid, it is possible to use as the electrolytic solution 50 a Na-free acidic aqueous solution having an electric conductivity of not more than 0.4/Ω·cm and containing, for example, at least one of HCl, $H_3PO_4$, $HNO_3$, HF and KCl. This also can reduce, from the side of the electrolytic solution 50, the influence of the terminal effect at the time of removal of a passive layer (ruthenium oxide) present on the surface of the barrier layer 5 composed of a ruthenium film, and can realize freedom from Na in the electrolytic solution

50. The electric conductivity of the electrolytic solution 50 is generally 0.001 to 0.4/Ω·cm, preferably 0.05 to 0.4/Ω·cm.

The operation of the electrolytic processing apparatus 22 will now be described. First, the substrate W is held with its front surface (with the barrier layer formed) facing upwardly by the substrate stage 34 by holding the edge of the substrate W with the substrate chucks 36. At this moment, the substrate stage 34 is in a lowered position. The substrate stage 34 is then raised to bring the peripheral portion of the upper surface of the substrate W, held by the substrate stage 34, into pressure contact with the seal ring 38, thereby forming the electrolytic solution chamber, circumferentially defined by the seal ring 38, over the upper surface of the substrate W. At the same time, the barrier layer 5, at the peripheral portion of the upper surface of the substrate W lying outside the seal ring 38, is brought into contact with the cathode contacts 40. Thereafter, the electrolytic solution 50, consisting of sulfuric acid having a concentration of 8 wt %, is supplied from the electrolytic solution supply section 52 into the electrolytic solution chamber circumferentially defined by the seal ring 38 and formed over the upper surface of the substrate W, and is held in the electrolytic solution chamber.

Next, the insoluble anode 44 in a raised position is lowered to immerse it in the electrolytic solution 50, and is further lowered and stopped at a position close to the upper surface of the substrate W held by the substrate stage 34. While rotating the substrate stage 34, thereby rotating the substrate W together with the seal ring 38 and the cathode contacts 40, the insoluble anode 44 is electrically connected to the anode of the power source 46 and the cathode contacts 40 to the cathode of the power source 46 to carry out electrolytic processing of the substrate surface, thereby removing a passive film (ruthenium oxide) present on the surface of the barrier layer 5 of ruthenium film. Thus, in this embodiment, water is subjected to cathodic electrolysis with the electrolytic solution 50, consisting of sulfuric acid having a concentration of 8 wt %, to generate hydrogen which electrochemically removes the passive film (ruthenium oxide) present on the surface of the barrier layer 5 of ruthenium film.

After completion of the electrolytic processing, the insoluble anode 44 and the cathode contacts 40 are disconnected from the power source 46, and the rotation of the substrate stage 34 is stopped. After raising the insoluble anode 44, the electrolytic solution 50 remaining on the upper surface of the substrate W is removed and recovered, e.g., by suction, and the substrate W after electrolytic processing is transported for the next process step.

Figure 4:
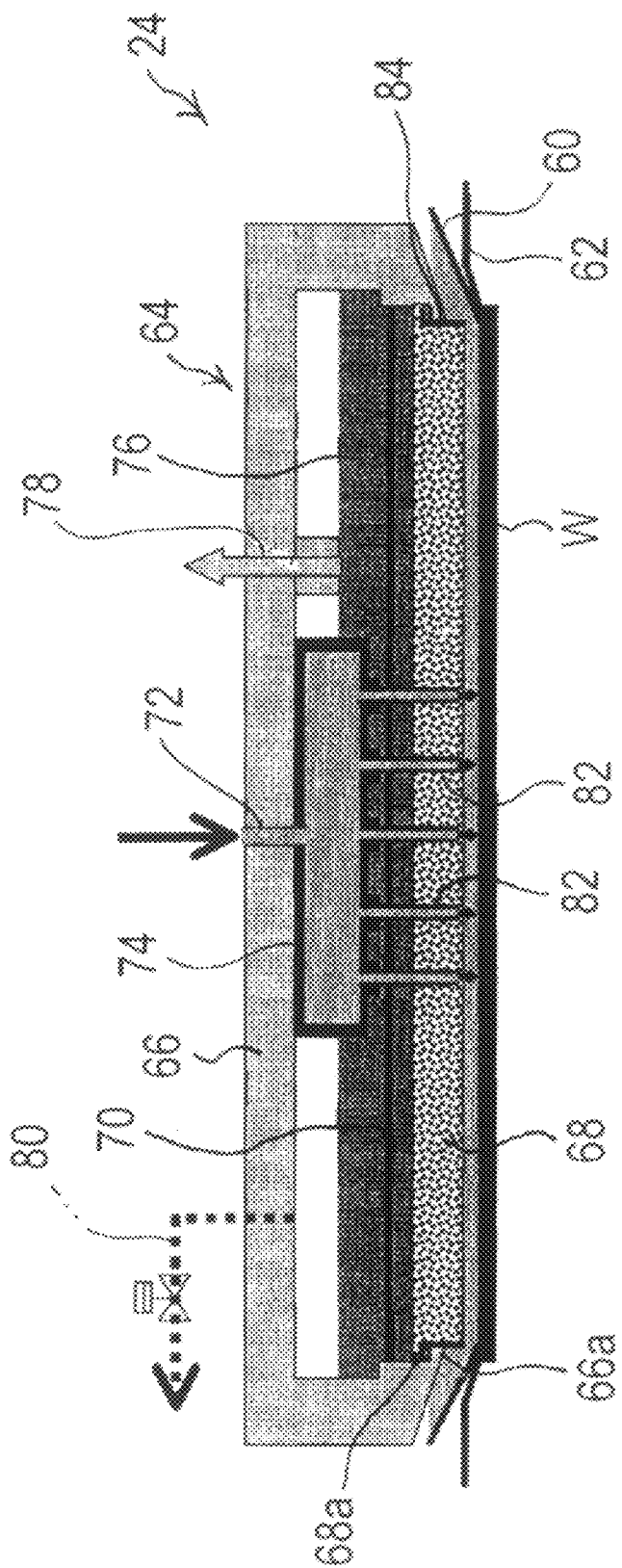
FIG. 4 is a schematic cross-sectional view of a copper electroplating apparatus for use in the substrate processing apparatus shown in FIG. 2.

FIG. 4 shows a schematic view of the copper electroplating apparatus 24. As with the above-described electrolytic processing apparatus 22, the copper electroplating apparatus 24 includes a rotatable and vertically-movable substrate stage (not shown) for detachably holding the substrate W with its front surface (with the barrier layer formed) facing upwardly. Above the substrate stage are disposed a ring-shaped seal ring 60 which, when the substrate W held by the substrate stage is raised, comes into pressure contact with a peripheral portion of the upper surface of the substrate W to seal the peripheral portion, and cathode contacts 62 for contact with the barrier layer 5 at such a peripheral portion of the upper surface of the substrate W that lies outside the contact portion of the substrate surface with the seal ring 60, to feed electricity to the barrier layer 5 and make the barrier layer 5 serve as a cathode. When the peripheral portion of the upper surface of the substrate W is sealed by the seal ring 60, a plating solution chamber, circumferentially defined by the seal ring 60, is formed over the upper surface of the substrate W. Because the cathode contacts 62 are located outside the seal ring 60, contact of the cathode contacts 62 with a plating solution, held in the plating solution chamber, can be avoided. Also in this embodiment, the seal ring 60 and the cathode contacts 62, while keeping contact with the peripheral portions of the upper surface of the substrate W held by the substrate stage, rotate together with the substrate stage.

A plating anode head 64 is vertically-movably disposed above the substrate stage. The plating anode head 64 includes a downwardly-open, bottomed cylindrical housing 66 and a high-resistance structure 68 disposed such that it closes the lower-end opening of the housing 66. In particular, the housing 66 has in its lower portion an inwardly-protruding portion 66a, and the high-resistance structure 68 has at its top a flange portion 68a. The high-resistance structure 68 is held in the housing 66 with the flange portion 68a engaging the inwardly-protruding portion 66a.

The high-resistance structure 68 may be composed of a porous ceramic, such as alumina, SiC, mullite, zirconia, titania or cordierite, or a hard porous body, such as a sintered body of polypropylene or polyethylene, or a composite thereof, or a woven or non-woven fabric. For example, a porous ceramic plate may be used which has a pore diameter of 30 to 200 μm in the case of an alumina ceramic, or not more than 30 μm in the case of SiC, a porosity of 20 to 95%, and a thickness of 1 to 20 mm, preferably 5 to 20 mm, more preferably 8 to 15 mm. In this embodiment, the high-resistance structure 68 is composed of a porous alumina ceramic plate, for example, having a porosity of 30% and an average pore diameter of 100 μm. Though the high-resistance structure 68, composed of such a porous ceramic plate, per se is an insulating material, it has an electric conductivity when it contains a plating solution. In particular, the plating solution penetrates the porous ceramic plate in the thickness direction though complicated, fairly long paths of the pores. This can provide the high-resistance structure 68 containing the plating solution with an electric conductivity which is lower than the electric conductivity of the plating solution.

The provision of the high-resistance structure 68, which can thus have a high electric resistance, at the opening of the housing 66 can make the influence of the resistance of the barrier layer 5 as small as negligible during plating. Thus, a difference in current density in the surface of the substrate W due to the electric resistance of the substrate surface can be made small, thereby enhancing the in-plane uniformity of a plated film.

In the housing 66, an insoluble anode 70 to be connected to the anode of a plating power source (not shown) is disposed above the high-resistance structure 68, and a plating solution introduction pipe 74, communicating with a plating solution introduction inlet 72, is disposed above the insoluble anode 70. The housing 66 has a plating solution discharge outlet 78 for discharging, by suction, a plating solution 76 from the housing 66. Further, to the housing 66 is connected an oxygen gas discharge pipe 80 for discharging oxygen gas, which has accumulated above the plating solution 76, from the housing 66.

The plating solution introduction pipe 74 has a manifold structure so that the plating solution 76 can be supplied uniformly to the high-resistance structure 68. Thus, a number of narrow tubes 82, which are in fluid communication with the plating solution introduction pipe 74, are coupled to the plating solution introduction pipe 74 at predetermined positions along the long direction of the plating solution introduction pipe 74. The insoluble anode 70 has narrow holes at positions corresponding to the narrow tubes 82, and the narrow tubes 82 extend downwardly through the narrow holes and further through the high-resistance structure 68, reaching the lower surface of the high-resistance structure 68.

The plating solution 76, introduced into the plating solution introduction pipe 74, passes through the narrow tubes 82 and reaches the lower surface of the high-resistance structure 68, and is supplied to the upper surface of the substrate W, while the plating solution 76 is discharged from the housing 66 through the plating solution discharge outlet 78. The plating solution 76 is thus allowed to circulate while impregnating the high-resistance structure 68 with the plating solution and immersing the insoluble anode 70 in the plating solution.

In this embodiment is used, as the plating solution 76, a copper sulfate plating solution having a copper content of 50 g/L, a sulfuric acid content of 80 g/L and a chlorine content of 50 ppm, and containing three additives called suppressor, accelerator and leveler. A significant difference in composition between the plating solution 76 and the electrolytic solution 50 can be avoided by thus using a copper sulfate plating solution as the plating solution 76 and using sulfuric acid, one component of the plating solution 76, as the electrolytic solution 50.

A band-like shield ring 84 is wrapped around the circumferential side surface of the high-resistance structure 68 to prevent electric current from flowing out of the circumferential side surface of the high-resistance structure 68. A flexible material, such as fluororubber, may be used for the shield ring 84.

The operation of the copper electroplating apparatus 24 will now be described. First, as with the above-described electrolytic processing apparatus 22, the substrate W is held with its front surface (With the barrier layer formed) facing upwardly by the substrate stage, and the substrate stage is raised to bring the peripheral portion of the upper surface of the substrate W, held by the substrate stage, into pressure contact with the seal ring 60, thereby forming the plating solution chamber, circumferentially defined by the seal ring 60, over the upper surface of the substrate W. At the same time, the barrier layer 5, at the peripheral portion of the upper surface of the substrate W lying outside the seal ring 60, is brought into contact with the cathode contacts 62.

Next, the plating anode head 64 in a raised position is lowered, and the lowering is stopped when the high-resistance structure 68 has come to a position as close to the upper surface of the substrate W as 0.5 to 3 mm. The plating solution 76 is then injected from the plating solution introduction pipe 74 into the space defined by the substrate W, the high-resistance structure 68 and the seal ring 60 to fill the space with the plating solution 76 while discharging the plating solution 76, by suction, from the plating solution discharge outlet 78. The plating solution 76 is thus circulated while impregnating the high-resistance structure 68 with the plating solution 76 and immersing the insoluble anode 70 in the plating solution 76 and, at the same time, a plating voltage is applied between the cathode contacts 62 and the insoluble anode 70, thereby forming a copper plated film on the surface of the substrate W, i.e., on the surface of the barrier layer 5 of ruthenium film. During the plating, the substrate W is rotated together with the seal ring 60 and the cathode contacts 62 at a low speed, as necessary.

After completion of the plating, the cathode contacts 62 and the insoluble anode 70 are disconnected from the plating power source and the supply of the plating solution is stopped, and then the plating anode head 64 is raised. Thereafter, the plating solution 76 remaining on the substrate W is removed and recovered, e.g., by suction, and the substrate W after plating is transported for the next process step.

Figure 5:
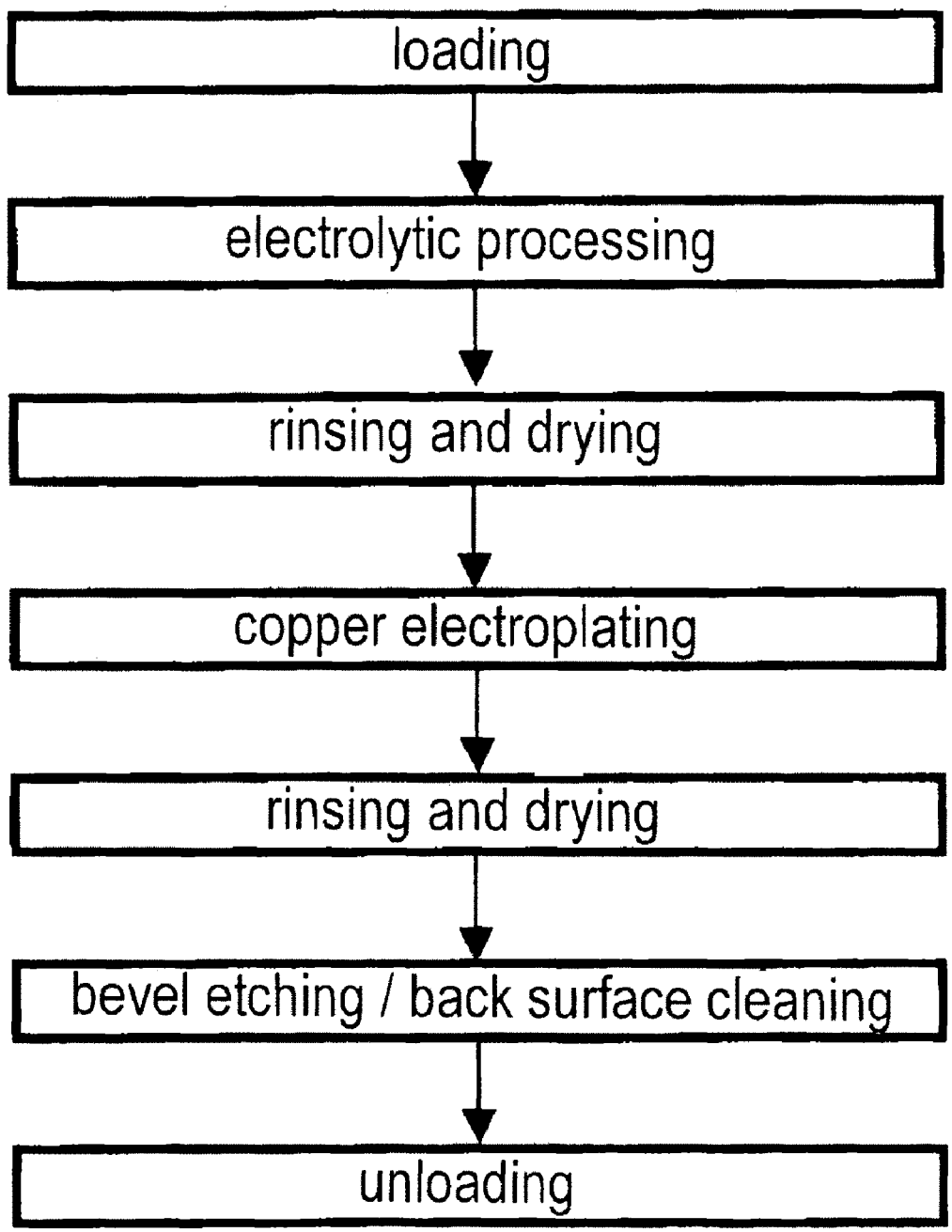
FIG. 5 is a flow chart of a process as carried out in the substrate processing apparatus shown in FIG. 2.

The operation of the substrate processing apparatus shown in FIG. 2 will now be described with reference to FIG. 5. First, a substrate cassette housing a plurality of substrates W is carried into the loading/unloading section 14 in the apparatus frame 12. The first transport robot 26 takes one substrate W out of the substrate cassette in the loading/unloading section 14 and transports the substrate W to the substrate station 18. The second transport robot 28 receives the substrate W from the substrate station 18 and transfers the substrate W to the substrate stage 34 of the electrolytic processing apparatus 22.

The electrolytic processing apparatus 22 carries out electrolytic processing of the substrate W, held by the substrate stage 34, in the above-described manner to electrochemically remove a passive film (ruthenium oxide) present on the surface of the barrier layer 5 of ruthenium film. If the electrolytic processing apparatus 22 has a function to rinse with pure water a surface of a substrate after electrolytic processing and dry the substrate by rotating it at a high speed, rinsing and drying of the substrate W is carried out in the electrolytic processing apparatus 22. Otherwise the substrate W after electrolytic processing is transported by the second transport robot 28 to the rinsing/drying apparatus 20, where the substrate is rinsed and dried.

It is possible, in some cases, to omit drying or both rinsing and drying.

The second transport robot 28 receives the substrate from the electrolytic processing apparatus 22 or from the rinsing/drying apparatus 20, and transports the substrate to the substrate stage of the copper electroplating apparatus 24. The copper electroplating apparatus 24 after receiving the substrate carries out plating of the substrate W, held by the substrate stage, in the above-described manner to form a copper plated film on the surface of the barrier layer 5 of ruthenium film. The substrate after plating is transported by the second transport robot 28 to the rinsing/drying apparatus 20, where the substrate is rinsed and dried. If the copper electroplating apparatus 24 has a function to rinse with pure water a surface of a substrate after plating and dry the substrate by rotating it at a high speed, rinsing and drying of the substrate W may be carried out in the copper electroplating apparatus 24.

The first transport robot 26 receives the substrate from the rinsing/drying apparatus 20 and transfers the substrate to the bevel etching/back surface cleaning apparatus 16. The bevel etching/back surface cleaning apparatus 16 carries out bevel etching to etch off a copper plated film, etc. adhering to the bevel portion of the substrate, and cleaning of the back surface of the substrate. The first transport robot 26 receives the substrate from the bevel etching/back surface cleaning apparatus 16 and returns the substrate to the substrate cassette in the loading/unloading section 14.

The series of substrate processing steps is thus completed.

The above-described substrate processing process can carry out, in a successive one-by-one manner, copper electroplating of a substrate shortly after carrying out electrolytic processing of the substrate to electrochemically remove a passive layer formed on the surface of the barrier layer 5 of ruthenium film, e.g., having a thickness of not more than 10 nm and having a high sheet resistance. This can prevent an oxide film (ruthenium oxide) from growing on the surface of the ruthenium film during the period after the removal of the passive layer until the initiation of copper plating. Furthermore, it becomes possible to control the time period after the electrolytic processing until the initiation of copper plating at a constant time.

Figure 7:
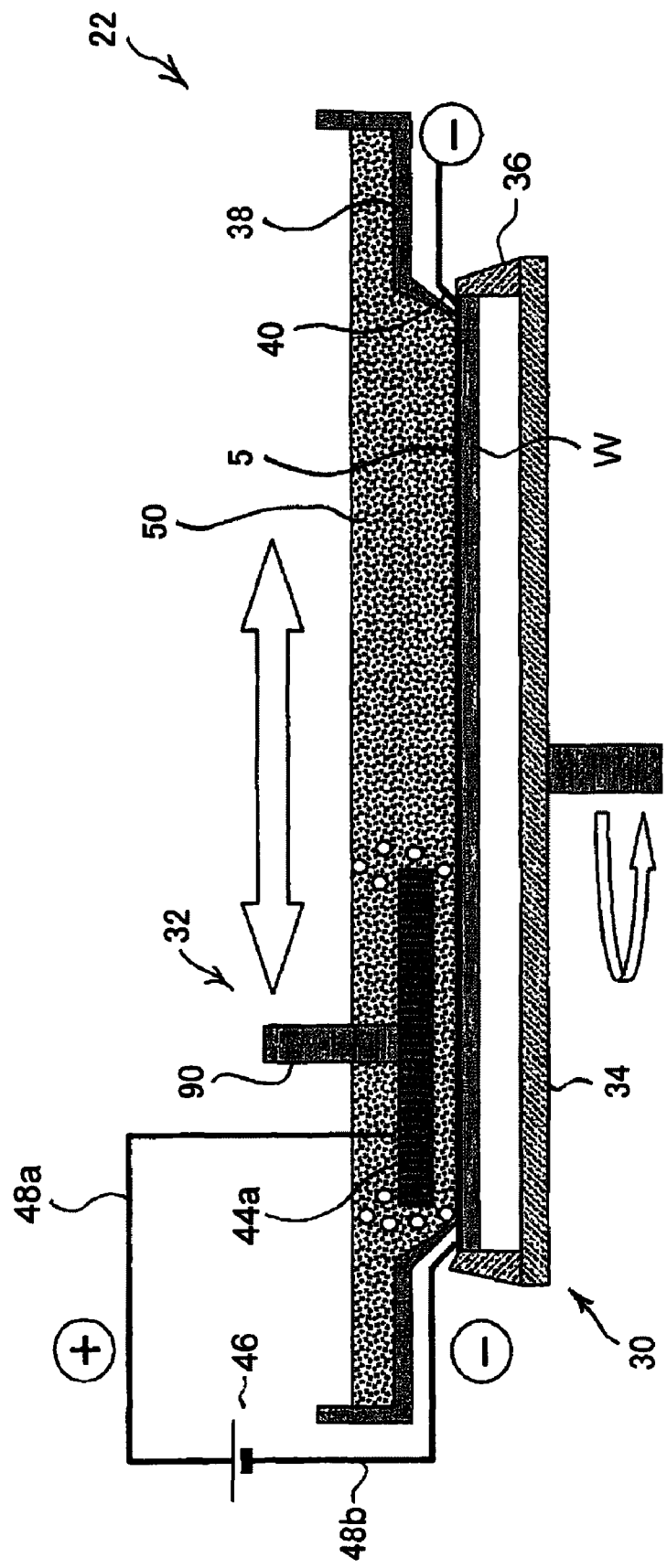
FIG. 7 is a schematic cross-sectional view of another electrolytic processing apparatus.
Figure 8:
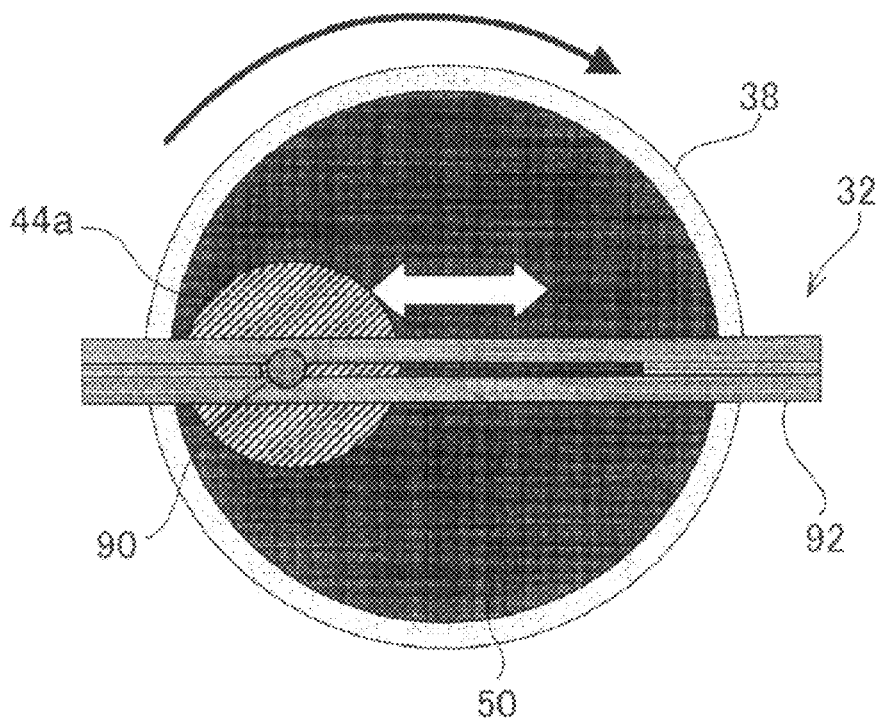
FIG. 8 is a plan view of FIG. 7.

FIGS. 7 and 8 show another electrolytic processing apparatus 22. The electrolytic processing apparatus 22 of this embodiment differs from the embodiment shown in FIG. 3 in the construction of the electrolytic processing anode head 32: Instead of the large-diameter insoluble anode 44 shown in FIG. 3, a small-diameter insoluble anode 44a having a diameter not more than one-half of the diameter of a substrate W is used in this embodiment, and the small-diameter insoluble anode 44a is allowed to reciprocate parallel to the substrate W by a slider 90 along a rail 92 extending along one diameter of the substrate W.

According to this embodiment, electrolytic processing of the barrier layer 5 of ruthenium film is carried out by reciprocating the small-diameter insoluble anode 44a parallel to the substrate W while rotating the substrate W together with the cathode contacts 40 and the seal ring 38. This manner of processing can reduce the influence of the terminal effect from the side of apparatus. It is noted in this regard that in electrolytic processing of a surface of a ruthenium film having a high sheet resistance, formed on a surface of a substrate, electrolysis concentrates in the periphery of the substrate when an insoluble anode having a large area is used. On the other hand, electrolysis can be distributed over an entire surface of a substrate by using an insoluble anode having a sufficiently smaller diameter than that of the substrate, and moving the anode parallel to the surface of the substrate in carrying out electrolytic processing. Thus, more uniform electrolytic processing can be effected on the entire surface of the substrate.

Figure 9:
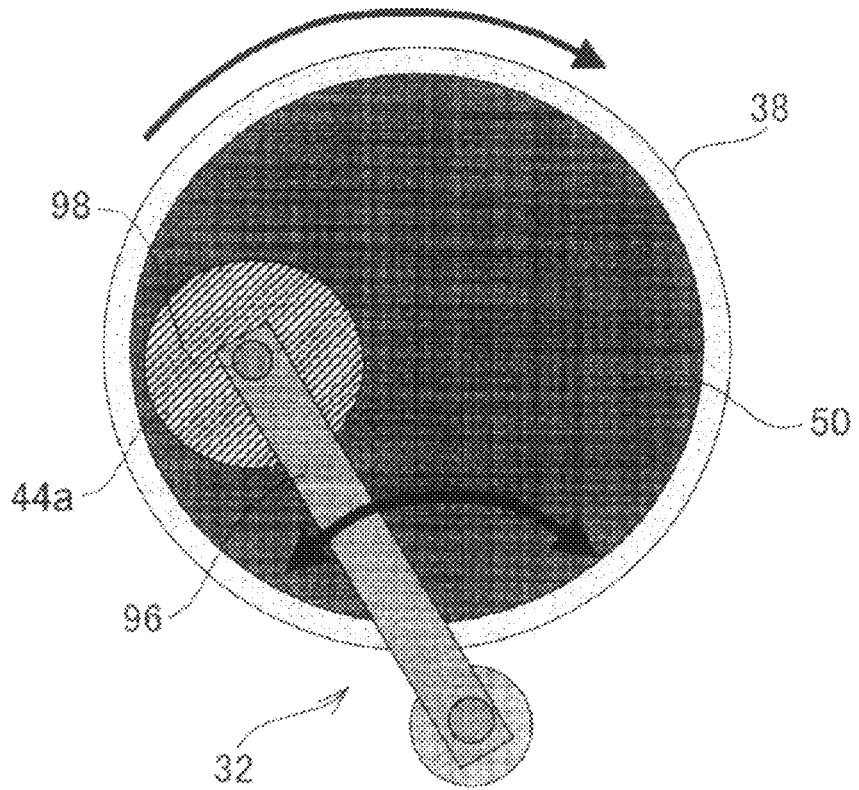
FIG. 9 is a schematic cross-sectional view of yet another electrolytic processing apparatus.

As shown in FIG. 9, it is also possible to so design the electrolytic processing anode head 32 that the small-diameter anode 44a is rotatably supported via a rotating shaft 98 at the front end of a pivot arm 96, and to carry out electrolytic processing of the barrier layer 5 of ruthenium film by pivoting the small-diameter insoluble anode 44a parallel to the substrate W while rotating the substrate W together with the cathode contacts 40 and the seal ring 38.

In the electrolytic processing apparatuses of the above embodiments, the insoluble anode is desirably positioned as close to a substrate as possible in carrying out electrolytic processing. Further, though not shown diagrammatically, the high-resistance structure 68 shown in FIG. 4 may be interposed between the insoluble anode and a substrate also in carrying out electrolytic processing, thereby further reducing the terminal effect.

Figure 10:
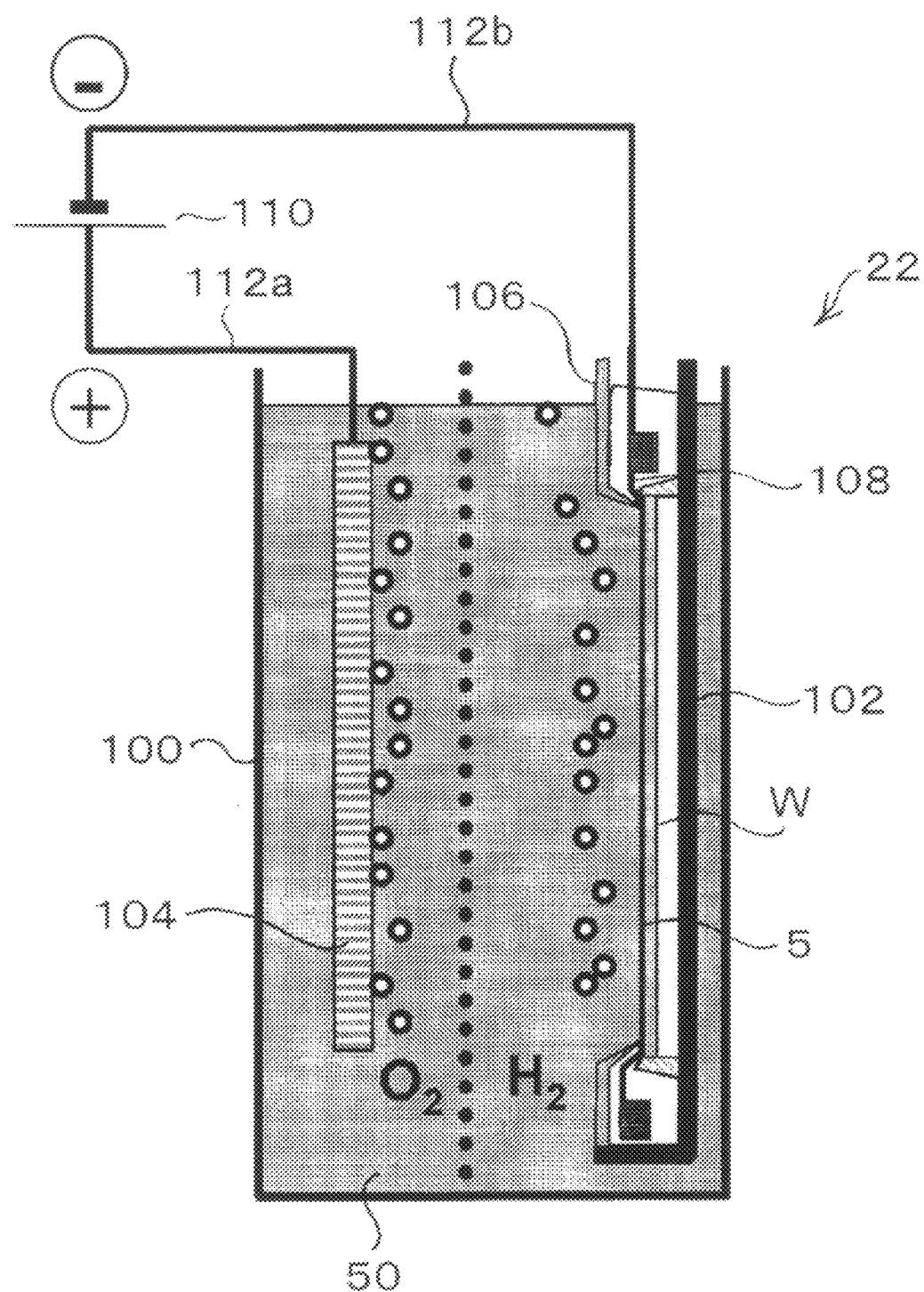
FIG. 10 is a schematic cross-sectional view of yet another electrolytic processing apparatus.

FIG. 10 shows yet another electrolytic processing apparatus 22. In this embodiment, a substrate W, held by a substrate holder 102, and an insoluble anode 104, both in a vertical position and facing each other, are disposed in an electrolytic processing cell 100 holding therein an electrolytic solution 50. A peripheral portion of the substrate W is sealed by a seal ring 106 provided in the substrate holder 102, and the surface barrier layer 5 of the substrate W serves as a cathode when in contact with cathode contacts 108. Thus, the insoluble anode 104 is electrically connected via an anode conducting wire 112a to the anode of a power source 110, while the cathode contacts 108 are electrically connected via a cathode conducting wire 112b to the cathode of the power source 110 when carrying out electrolytic processing of the surface of the substrate W.

Figure 11:
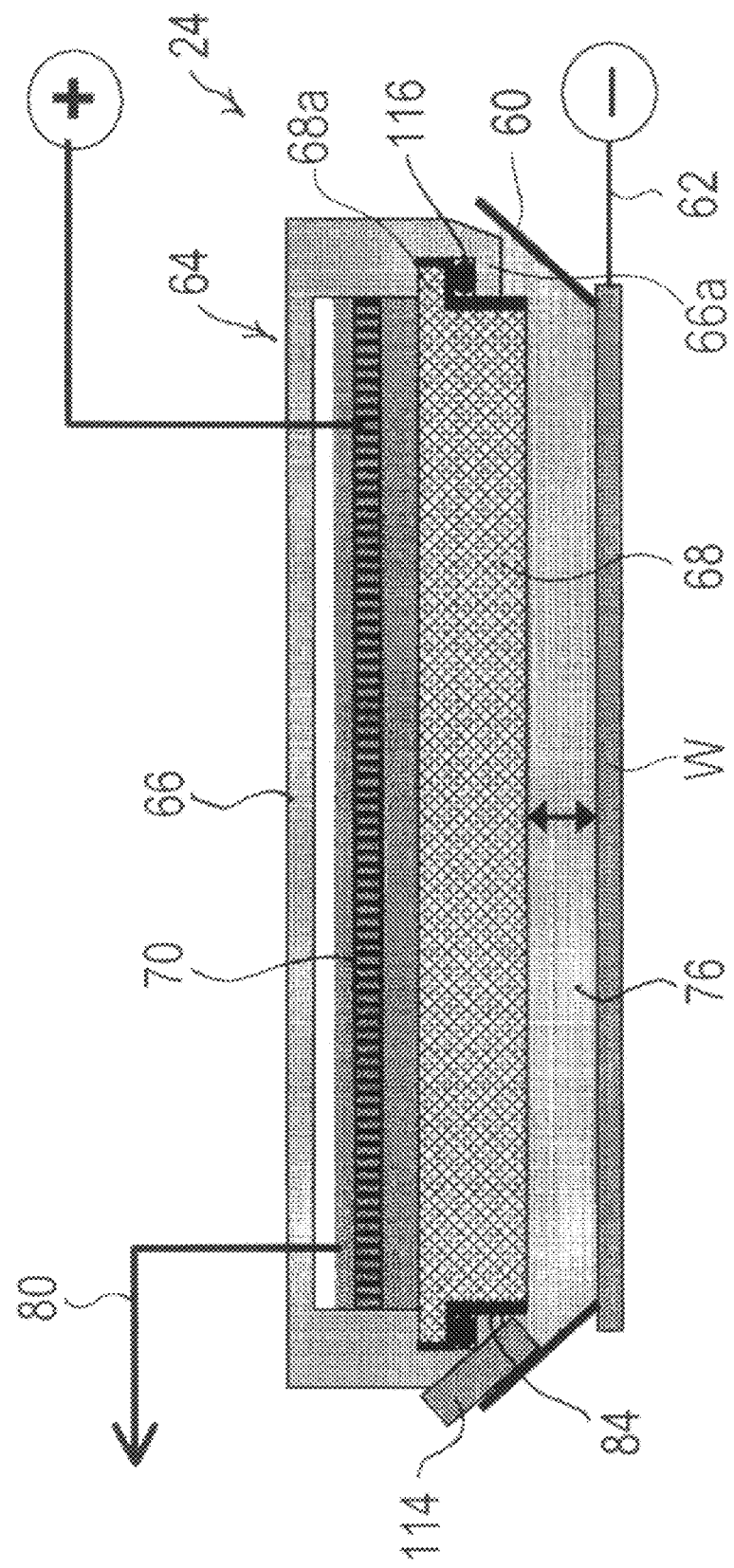
FIG. 11 is a schematic cross-sectional view of another copper electroplating apparatus.

FIG. 11 shows another copper electroplating apparatus 24. The apparatus of this embodiment differs from the embodiment shown in FIG. 4 in that instead of the plating solution introduction pipe 74 and the narrow tubes 82, both for introduction of a plating solution, shown in FIG. 4, a plating solution injection pipe 114 is provided in the side of the housing 66 so that the plating solution 76 is passed through the injection pipe 114 and directly injected into the space between the high-resistance structure 68 and a substrate W. Further, an O-ring 116 is interposed between the inwardly-protruding portion 66a of the housing 66 and the flange portion 68a of the high-resistance structure 68. In addition, an insoluble anode having a large number of fine pores is used as the insoluble anode 70.

According to this embodiment, upon injection of the plating solution 76 from the plating solution injection pipe 114 into the space between the high-resistance structure 68 and the substrate W, a flow of the plating solution flowing in one direction along the surface of the substrate W is created, thereby facilitating release of bubbles.

Figure 12:
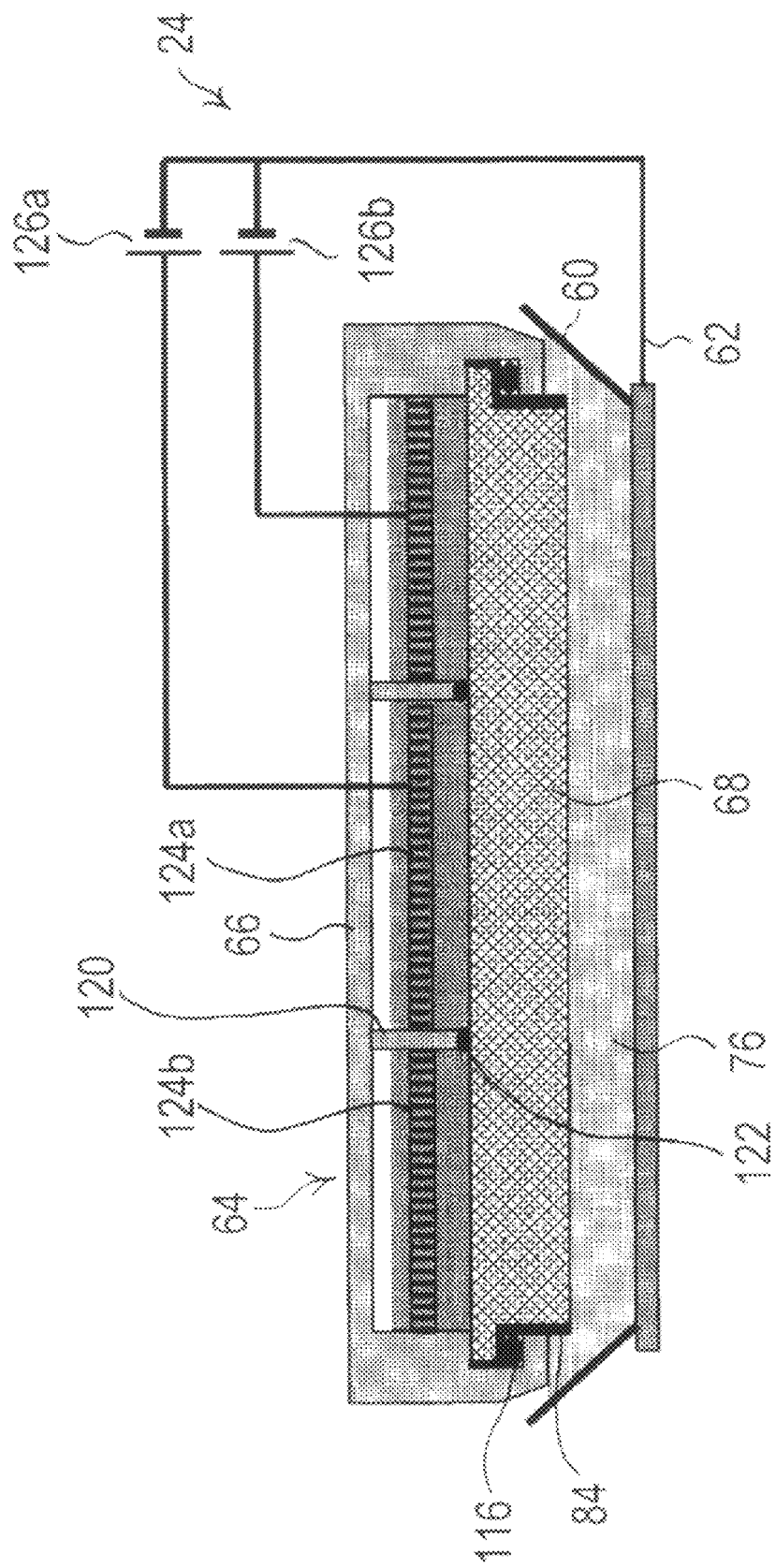
FIG. 12 is a schematic cross-sectional view of yet another copper electroplating apparatus.

FIG. 12 shows yet another copper electroplating apparatus. The apparatus of this embodiment differs from the embodiment shown in FIG. 11 in that, instead of the disk-shaped insoluble anode 70 shown in FIG. 11, two concentrically-divided insoluble anodes 124a, 124b, which are divided and electrically isolated from each other by a ring-shaped partition 120 that reaches the ceiling of the housing 66 and an O-ring 122 interposed between the lower end of the partition 120 and the high-resistance structure 68 are used, and in that the divided insoluble anodes 124a, 124b are individually connected to the anodes of different plating power sources 126a, 126b.

According to this embodiment, for example, in an initial plating period, the current density between the centrally-located divided insoluble anode 124a and the central portion of the substrate W serving as a cathode can be made higher than the current density between the peripherally-located divided insoluble anode 124b and the peripheral portion of the substrate serving as a cathode. This can reduce the terminal effect caused by the barrier layer 5 of ruthenium film having a high sheet resistance, for example, thereby forming a plated film having a more uniform thickness on the surface of the barrier layer 5.

Figure 13:
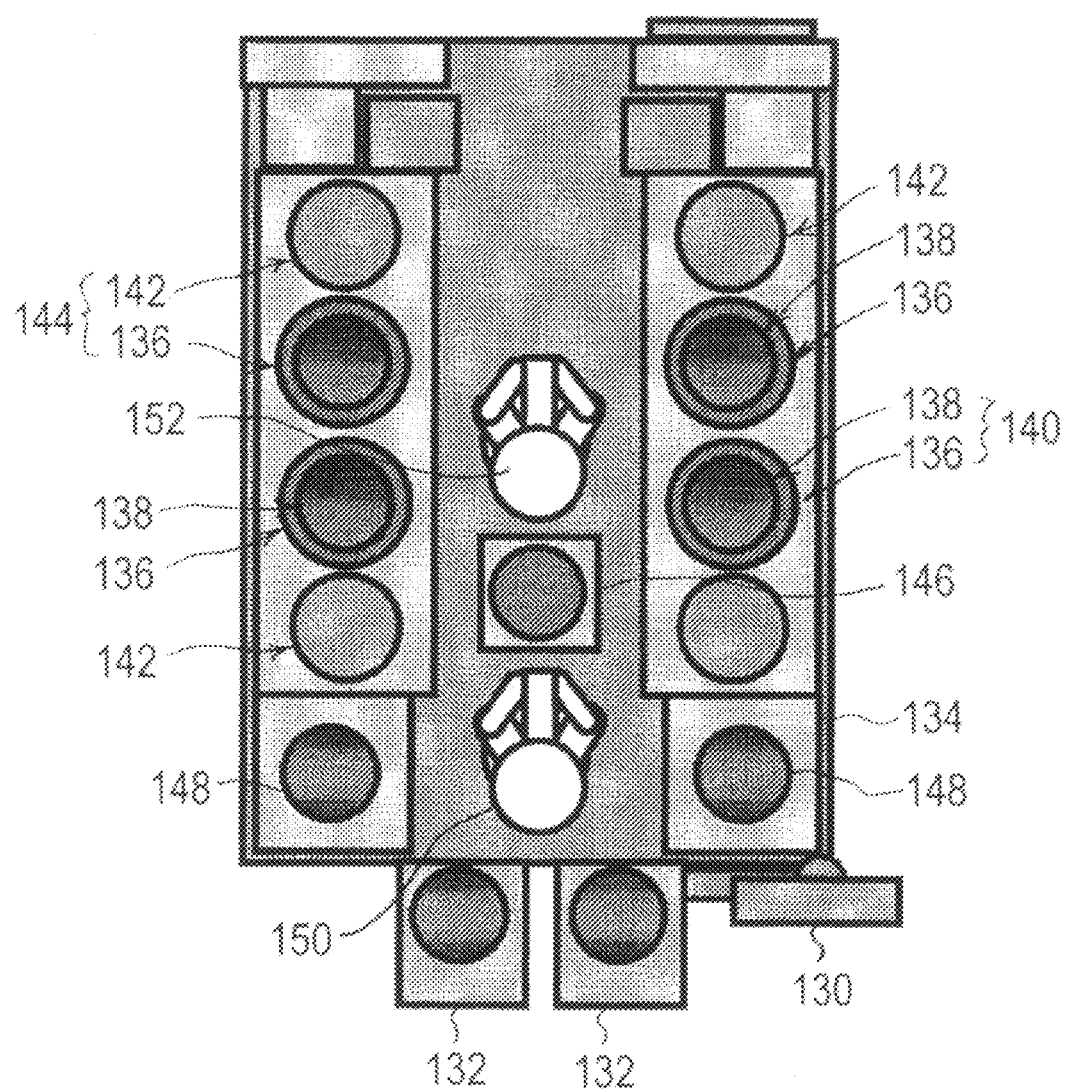
FIG. 13 is a layout plan view of a substrate processing apparatus according to another embodiment of the present invention.

FIG. 13 shows a substrate processing apparatus according to another embodiment of the present invention. The substrate processing apparatus includes a control panel 130 and an apparatus frame 134 to which are attached two external FOUPs (front opening unified pod) 132 each housing therein a large number of substrates. In the apparatus frame 134 are disposed a total of four electrolytic processing apparatuses 140 each comprised of a common substrate processing section 136 and an electrolytic processing anode head 138, a total of four copper electroplating apparatuses 144 each comprised of the common substrate processing section 136 and a plating anode head 142, a substrate station 146, and two bevel etching/back surface cleaning apparatuses 148. Further, a fixed-type first transport robot 150 is disposed between the FOUPs 132, the bevel etching/back surface cleaning apparatuses 148 and the substrate station 146, and a fixed-type second transport robot 152 is disposed between the substrate station 146 and the substrate processing sections 136.

Figure 15:
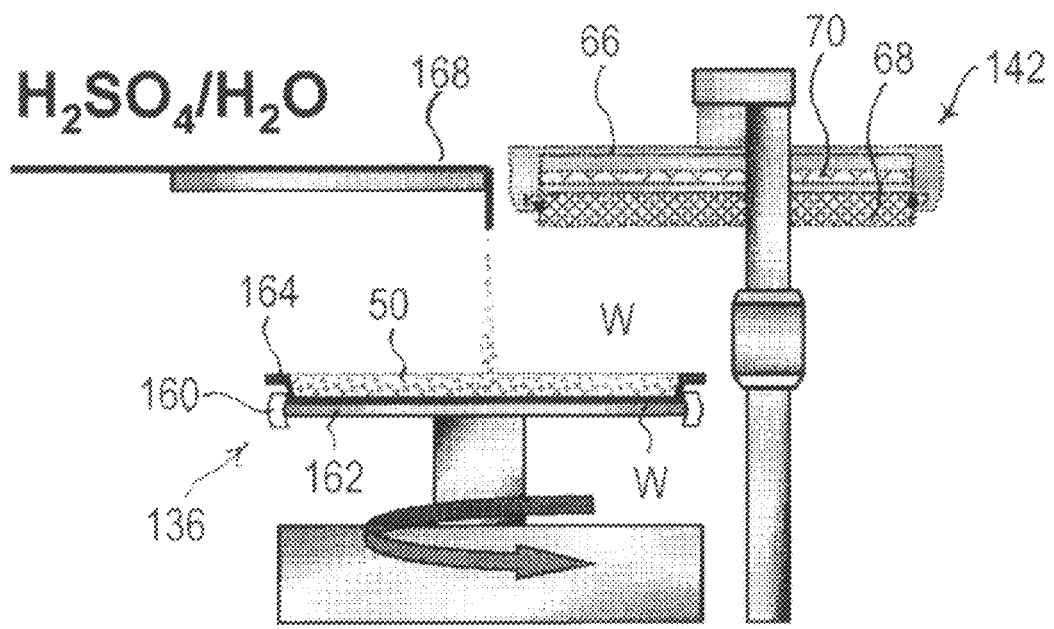
FIG. 15 is a schematic diagram of the substrate processing section of the substrate processing apparatus shown in FIG. 13, illustrating the substrate processing section when supplying an electrolytic solution (sulfuric acid) to the surface of the substrate held by the substrate stage.
Figure 16:
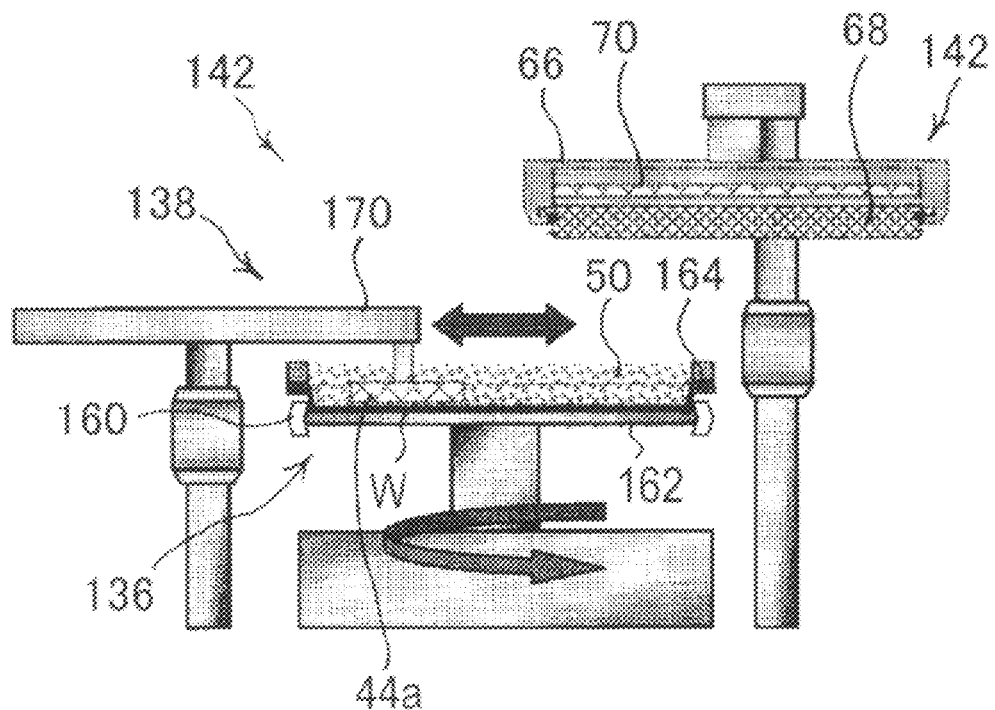
FIG. 16 is a schematic diagram illustrating electrolytic processing of the substrate using an electrolytic processing apparatus of the substrate processing apparatus shown in FIG. 13.
Figure 17:
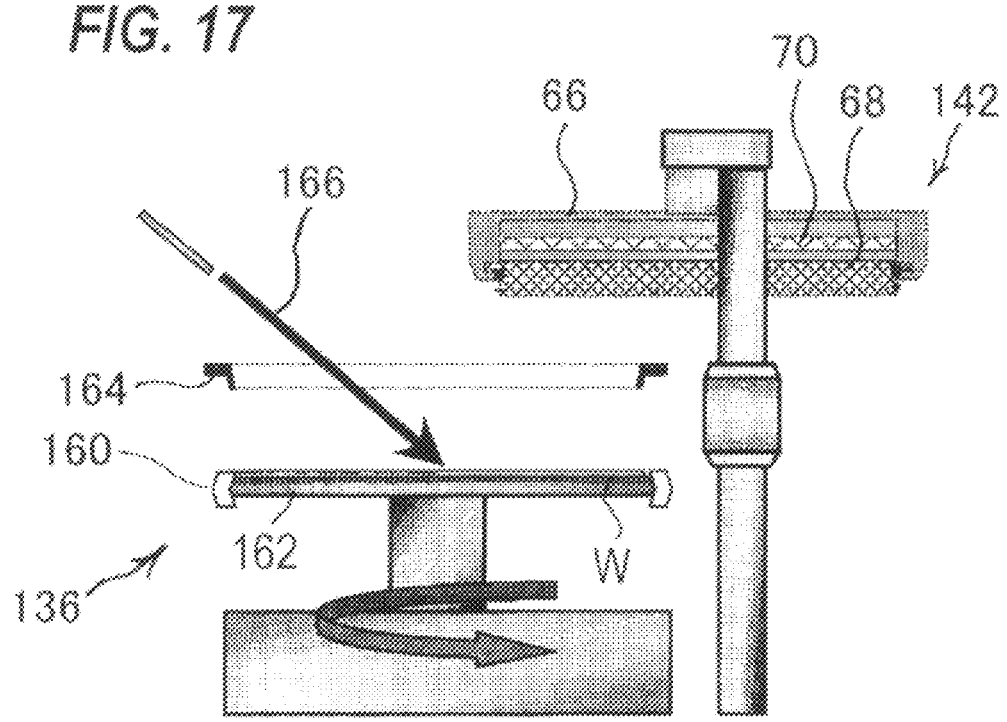
FIG. 17 is a schematic diagram illustrating rinsing of the substrate after electrolytic processing, carried out in the substrate processing apparatus shown in FIG. 13.
Figure 18:
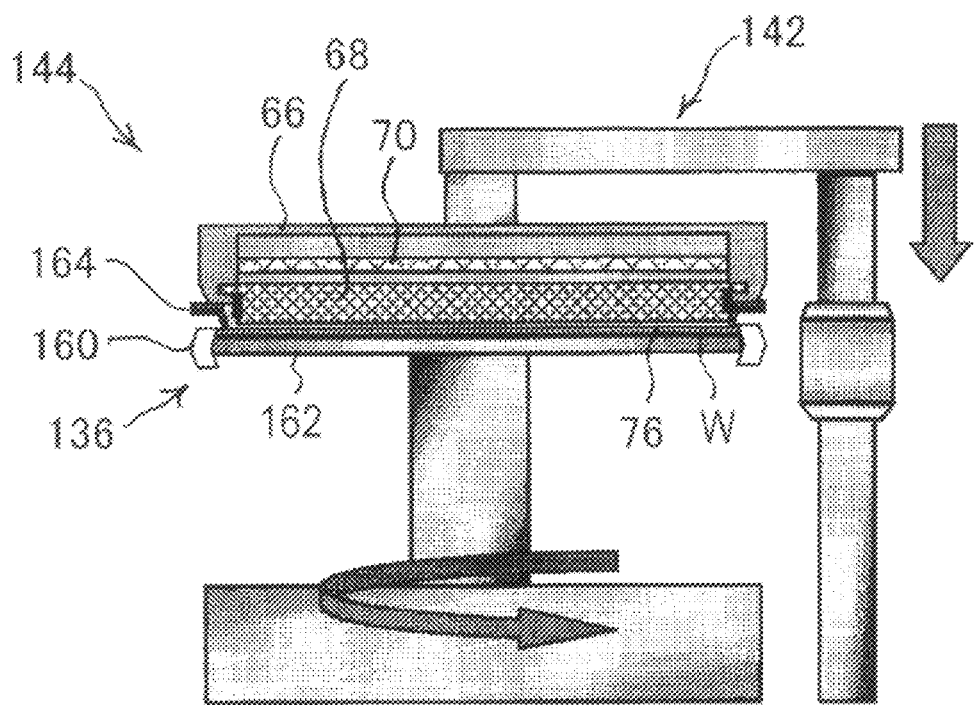
FIG. 18 is a schematic diagram illustrating copper electroplating of the substrate using a copper electroplating apparatus of the substrate processing apparatus shown in FIG. 13.
Figure 19:
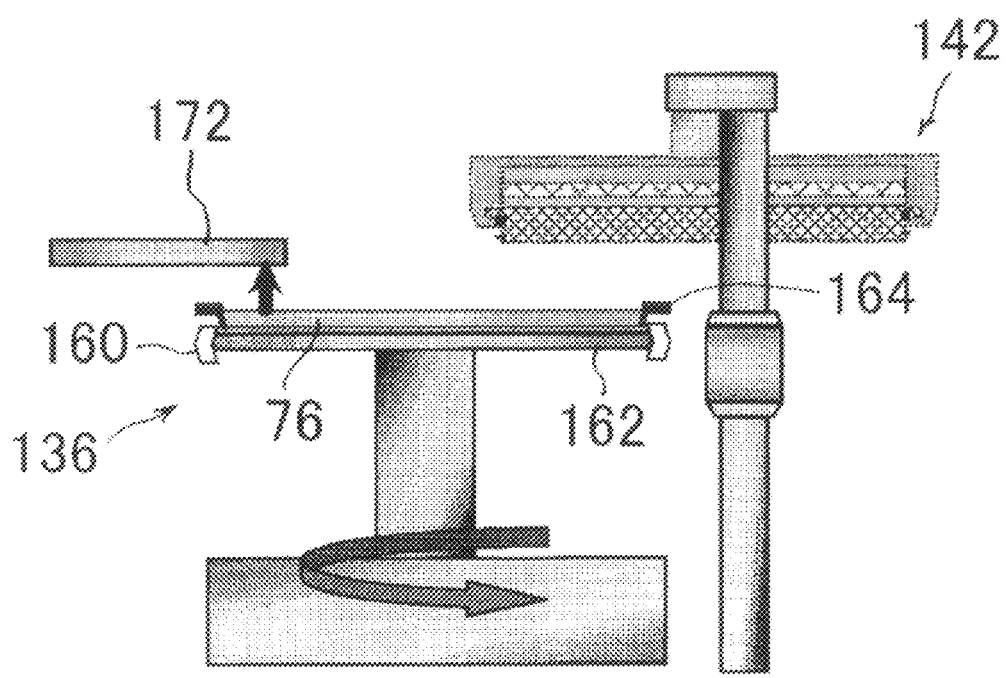
FIG. 19 is a schematic diagram illustrating removal of a plating solution remaining on the surface of the substrate after plating, carried out in the substrate processing apparatus shown in FIG. 13.
Figure 20:
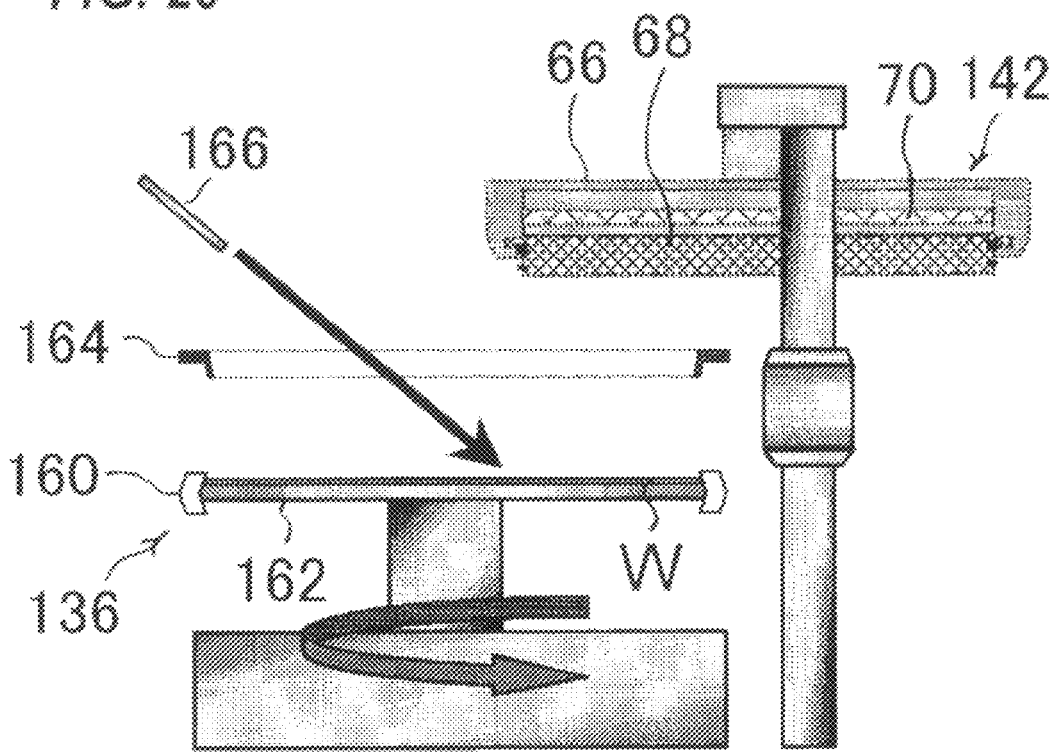
FIG. 20 is a schematic diagram illustrating rinsing of the substrate after plating, carried out in the substrate processing apparatus shown in FIG. 13.

As shown in FIGS. 14 through 21, and as with the substrate processing section 30 of the electrolytic processing apparatus 22 shown in FIG. 3, the substrate processing section 136 includes a rotatable and vertically-movable substrate stage 162 having substrate chucks 160 on the periphery of the upper surface, a ring-shaped seal ring 164 disposed above the substrate stage 162, and cathode contacts (not shown in FIGS. 14 through 21). As shown in FIGS. 17 and 20, the substrate holder 136 also includes a pure water supply nozzle 166 for supplying rinsing pure water to a surface of a substrate W held by the substrate stage 162.

The electrolytic processing anode head 138 includes an electrolytic solution supply section 168 for supplying an electrolytic solution 50 into an electrolytic solution chamber as formed when the substrate W held by the substrate stage 162 is raised to bring the seal ring 164 into pressure contact with a peripheral portion of the upper surface of the substrate W, as shown in FIG. 15 and, in this embodiment, the insoluble anode 44a shown in FIGS. 7 and 8, having a smaller diameter than the diameter of the substrate W, as shown in FIG. 16. The insoluble anode 44a is supported at the front end of a vertically-movable support arm 170 and is capable of reciprocating parallel to the substrate W.

Similarly to the plating anode head 64 of the copper electroplating apparatus shown in FIG. 11, the plating anode head 142 includes a housing 66, a high-resistance structure 68 and an insoluble anode 70. As shown in FIG. 19, an aspirator 172 is provided for removing and recovering, by suction, a plating solution remaining on the surface of the substrate W. Though not shown in FIGS. 14 through 21, as with the plating anode head 64 of the copper electroplating apparatus shown in FIG. 11, the plating anode head 142 is provided with a plating solution injection pipe in the side of the housing 66.

Figure 22:
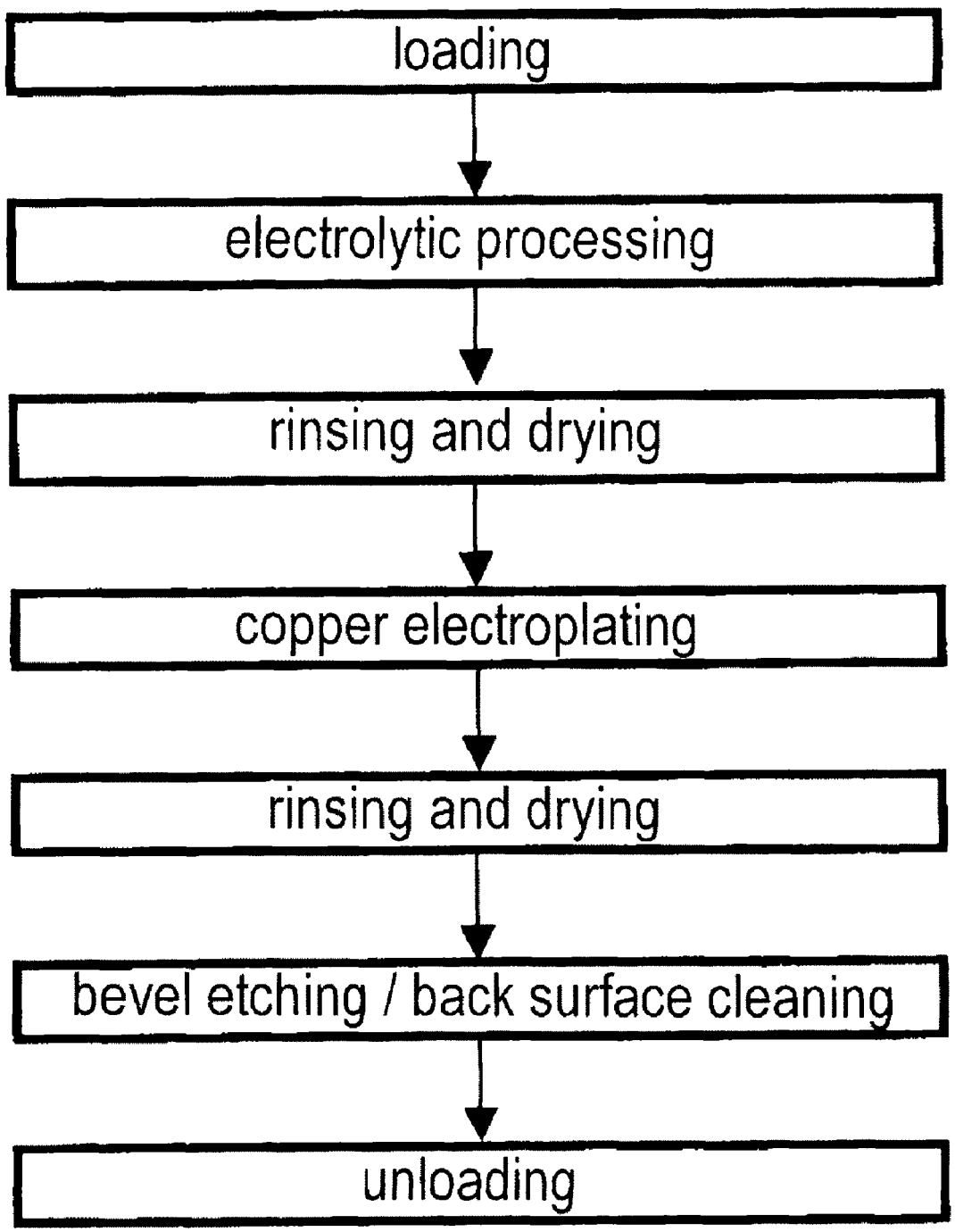
FIG. 22 is a flow chart of a process as carried out in the substrate processing apparatus shown in FIG. 2.

The operation of the substrate processing apparatus shown in FIG. 13 will now be described also with reference to FIG. 22. First, the FOUP 132 housing substrates W is externally attached to the apparatus frame 134. The first transport robot 150 takes one substrate W out of the external FOUP 132 attached to the apparatus frame 134 and transports the substrate W to the substrate station 146. The second transport robot 152 receives the substrate W from the substrate station 146 and transfers it to the substrate stage 162 of one of the substrate processing sections 136.

Figure 14:
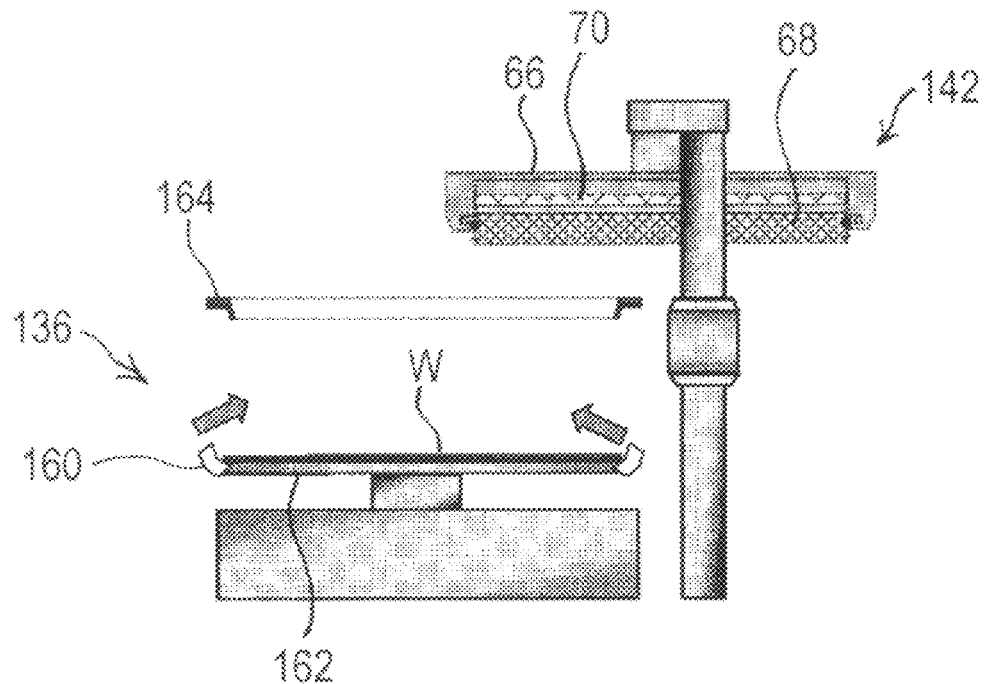
FIG. 14 is a schematic diagram of a substrate processing section of the substrate processing apparatus shown in FIG. 13, illustrating the substrate processing section when holding a substrate by a substrate stage.

The substrate stage 162 holds the substrate W by holding the edge of the substrate W with the substrate chucks 160, as shown in FIG. 14. The substrate stage 162 holding the substrate W is then raised to bring the seal ring 164 into pressure contact with the peripheral portion of the upper surface of the substrate W, thereby forming the electrolytic solution chamber, circumferentially defined by the seal ring 164, over the upper surface of the substrate W. Thereafter, while rotating the substrate W, an electrolytic solution 50, which in this embodiment is sulfuric acid having a concentration of 8 wt %, is supplied from the electrolytic solution supply section 168 into the electrolytic solution chamber, as shown in FIG. 15.

Next, the insoluble anode 44a of the electrolytic processing anode head 138 in a retreat position is moved to a position right above the substrate W, and is then lowered to immerse it in the electrolytic solution 50, and is further lowered and stopped at a position close to the upper surface of the substrate W held by the substrate stage 162. While rotating the substrate W and reciprocating the insoluble anode 44a, electrolytic processing of the substrate surface is carried out in the same manner as described above, thereby removing a passive film (ruthenium oxide) present on the surface of the barrier layer 5 of ruthenium film, as shown in FIG. 16.

After completion of the electrolytic processing, the insoluble anode 44a of the electrolytic processing anode head 138 is returned to the retreat position, and the electrolytic solution 50 remaining on the substrate W is removed and recovered, e.g., by suction, and then the substrate stage 162 is lowered. Thereafter, as shown in FIG. 17, while rotating the substrate W at a low speed, rinsing pure water is supplied from the pure water supply nozzle 166 to the surface of the substrate W to rinse the surface of the substrate W, and then the substrate W is dried by rotating it at a high speed.

Next, the substrate stage 162 holding the substrate W is again raised to bring the seal ring 164 into pressure contact with the peripheral portion of the upper surface of the substrate W, thereby forming the plating solution chamber, circumferentially defined by the seal ring 164, over the upper surface of the substrate W. Thereafter, the plating anode head 142 in a retreat position is moved to right above the substrate W, and then lowered. The lowering of the plating anode head 142 is stopped when the high-resistance structure 68 has reached a predetermined position. Thereafter, a plating solution 76 is injected into the space between the substrate W and the high-resistance structure 68, and a copper plated film is formed on the surface of the barrier layer 5 of ruthenium film in the same manner as described above, as shown in FIG. 18.

Figure 21:
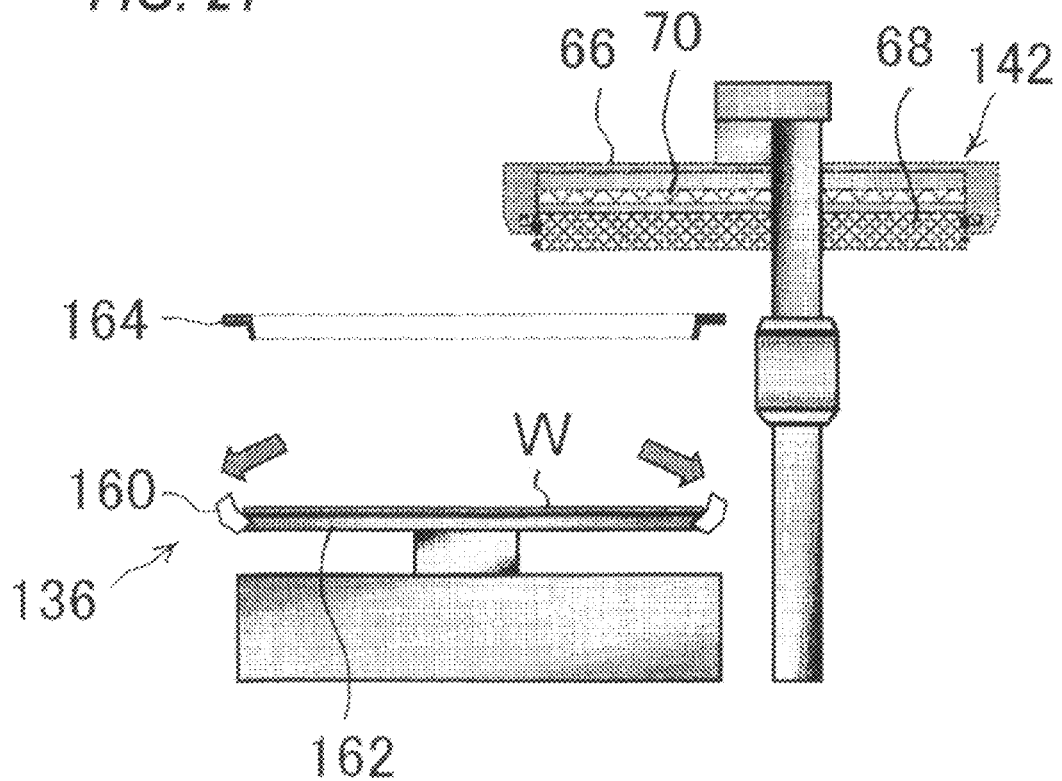
FIG. 21 is a schematic diagram of the substrate processing section of the substrate processing apparatus shown in FIG. 13, illustrating the substrate processing section when releasing the substrate from the holding by the substrate stage.

After completion of the plating, the plating anode head 142 is returned to the retreat position, and the plating solution 76 remaining on the substrate W is removed and recovered by the aspirator 172, and then the substrate stage 162 is lowered. Thereafter, as shown in FIG. 20, while rotating the substrate W at a low speed, rinsing pure water is supplied from the pure water supply nozzle 166 to the surface of the substrate W to rinse the surface of the substrate W, and then the substrate W is dried by rotating it at a high speed. Thereafter, the substrate W is released from the holding by the substrate chucks 160, as shown in FIG. 21.

The second transport robot 152 receives the substrate W from the substrate stage 162 of the substrate processing section 136 and transports the substrate onto the substrate station 146. The first transport robot 150 receives the substrate W from the substrate station 146 and transfers it to the bevel etching/back surface cleaning apparatus 148. The bevel etching/back surface cleaning apparatus 148 carries out bevel etching to etch off a copper plated film, etc. adhering to the bevel portion of the substrate W, and cleaning of the back surface of the substrate. The first transport robot 150 receives the substrate from the bevel etching/back surface cleaning apparatus 16 and returns the substrate to the FOUR 132.

The series of substrate processing steps is thus completed.

According to this embodiment, electrolytic processing by the electrolytic processing apparatus 140 and copper electroplating by the copper electroplating apparatus 144 can be carried out successively while holding the substrate W with the substrate stage 162 of the substrate processing section 136. This makes it possible to significantly shorten the processing time for one substrate and shorten the time period after the removal of the passive layer (ruthenium film) by electrolytic processing until the initiation of copper plating, thereby more securely preventing an oxide film (ruthenium oxide) from growing on the surface of the ruthenium film. In addition, the throughput can be increased.

Figure 23:
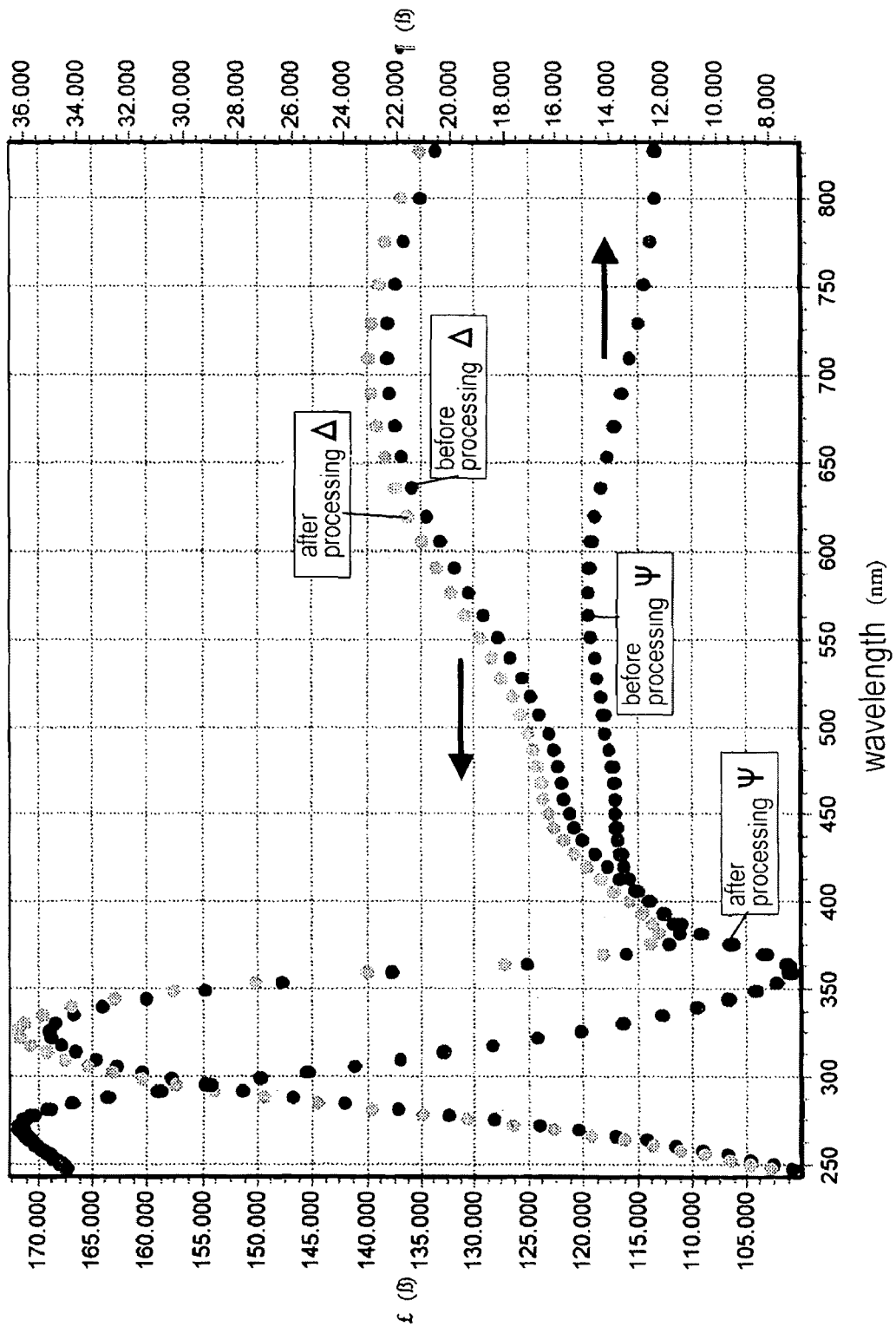
FIG. 23 is a graph showing a change in phase difference Δ and a change in amplitude reflectance tan Ψ before and after electrolytic processing.

FIG. 23 shows a change in phase difference $\Delta$ and a change in amplitude reflectance tan $\Psi$, the changes indicating change in the surface state of ruthenium film, as measured by spectroscopic ellipsometry on a surface of a ruthenium film before and after carrying out electrolytic processing of the surface of the ruthenium film having a sheet resistance of 80 $\Omega/\square$ at a current density of 20 mA/cm$^2$ for one minute. In the electrolytic processing, oxygen is generated at a surface of an insoluble anode and hydrogen is generated at a surface a barrier layer, composed of a ruthenium film, serving as a cathode. As a result, there is a change in the wavelength dispersion, as shown in FIG. 23.

Figure 24:
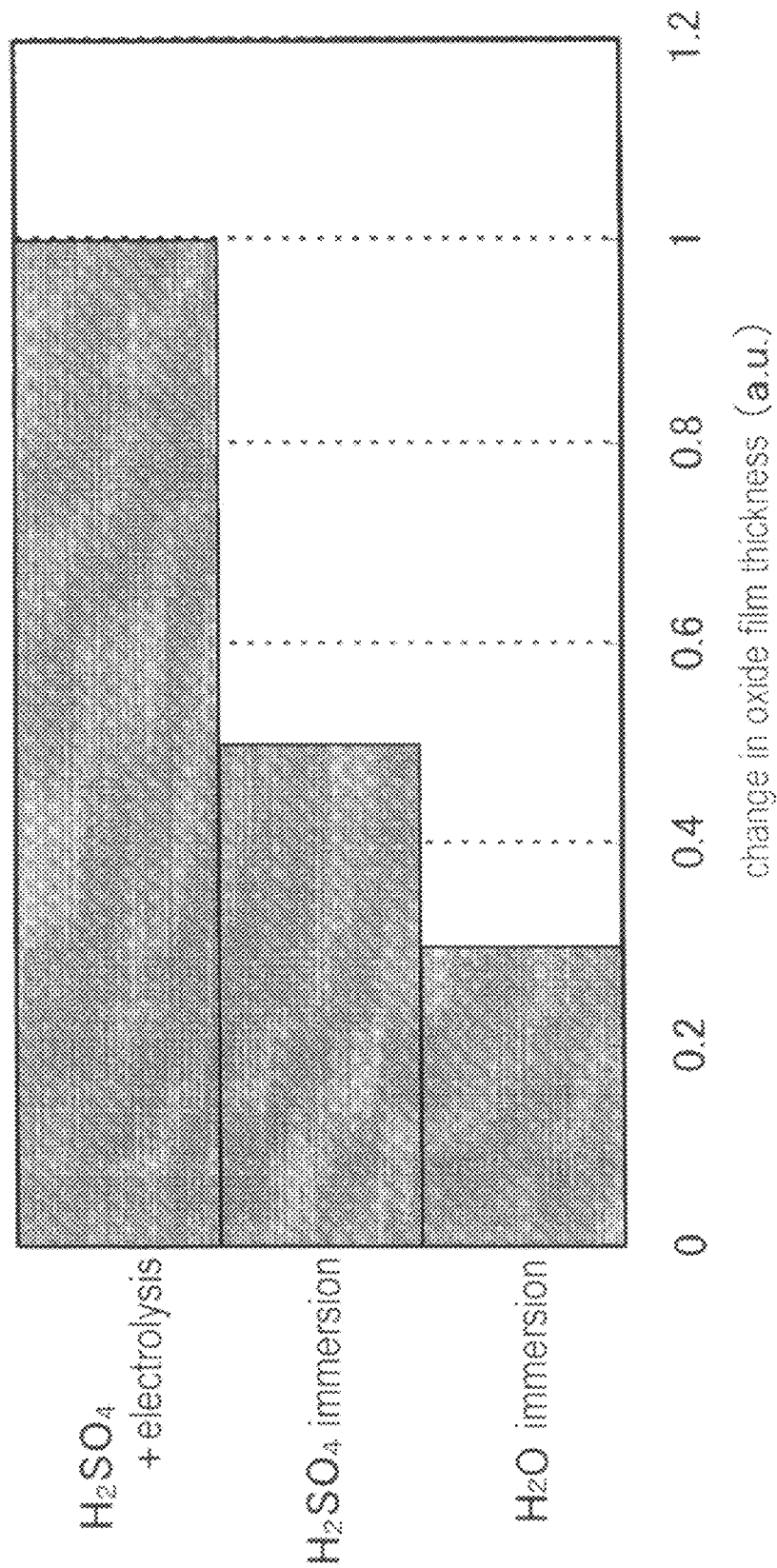
FIG. 24 is a graph showing changes in a thickness of a ruthenium oxide film after immersing the film in water, after immersing the film in sulfuric acid, and after carrying out electrolytic processing while immersing the film in sulfuric acid.

FIG. 24 shows changes in a thickness of a ruthenium oxide film after immersing a substrate, having a surface ruthenium film having a sheet resistance of 80 $\Omega/\square$, in water ($H_2O$ immersion), after immersing the substrate in sulfuric acid ($H_2SO_4$ immersion), and after carrying out electrolytic processing of the substrate at a current density of 20 mA/cm$^2$ for one minute ($H_2SO_4$+electrolysis), as obtained by measuring a change in phase difference $\Delta$ and a change in amplitude reflectance tan $\Psi$ by spectroscopic ellipsometry on the respective films and converting the changes into a thickness of a ruthenium oxide film. As can be seen from FIG. 24, a ruthenium oxide film is little removed by treatment solely with sulfuric acid and can be removed by adding electrolysis thereto.

Figure 25:
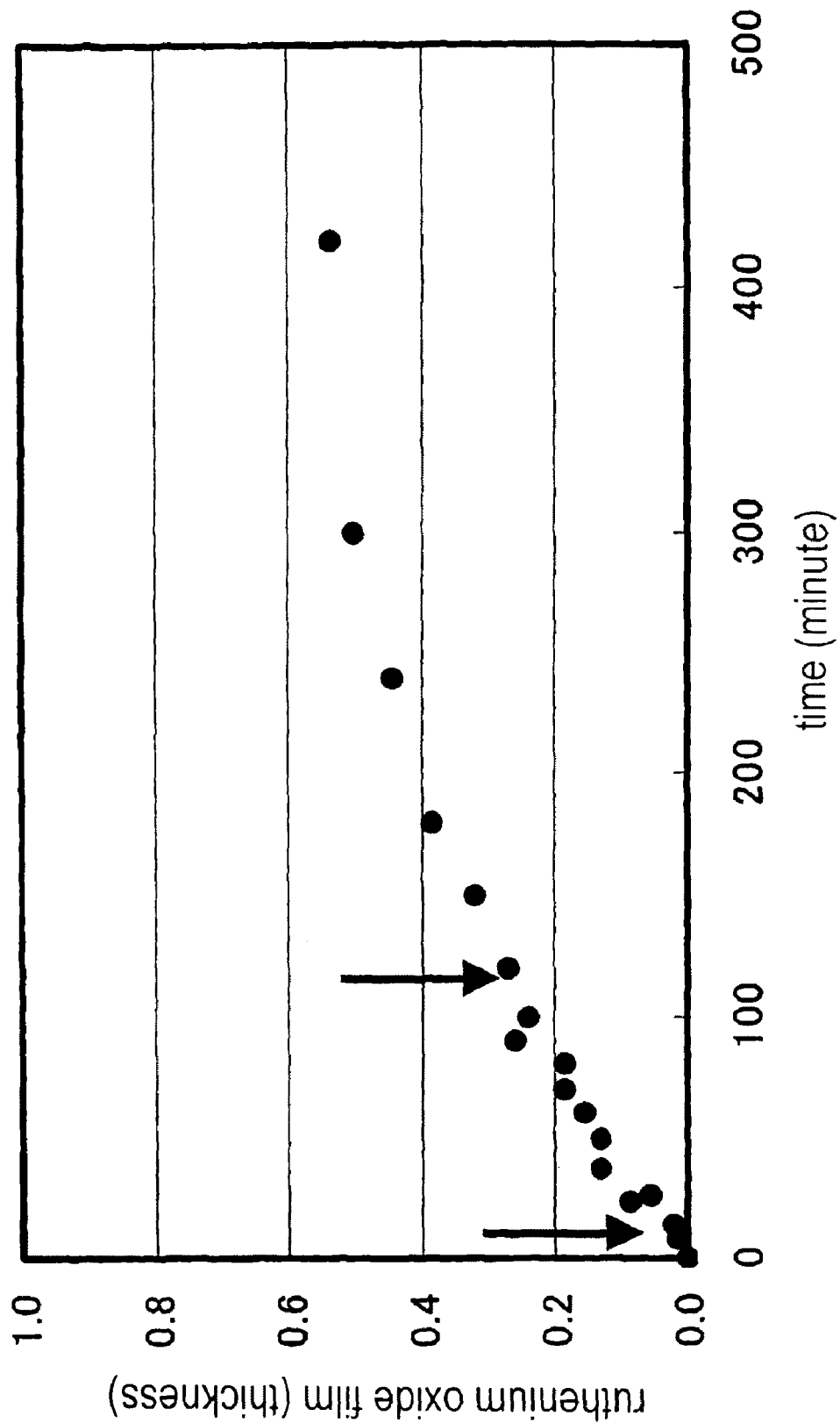
FIG. 25 is a graph showing a change in a thickness of a ruthenium oxide film formed in a substrate surface as observed when the substrate having a ruthenium film in the surface is left to stand in the air after carrying out electrolytic processing of the substrate surface.

FIG. 25 shows a change in a thickness of a ruthenium oxide film formed in a substrate surface, as observed when the substrate having a surface ruthenium film having a sheet resistance of 80 $\Omega/\square$ is left to stand in the air after carrying out electrolytic processing of the substrate surface. As can be seen from FIG. 25, a ruthenium oxide film starts to grow immediately after electrolytic processing and the thickness of the ruthenium oxide film comes to approximately 60% of a thickness of a ruthenium oxide film formed before electrolytic processing after an elapse of about 500 minutes. It is therefore desirable to carry out plating immediately after electrolytic processing. In this connection, it is preferred to carry out processing in a successive one-by-one manner rather than carrying out processing in a batch-wise manner. Further, it becomes possible to control the quality of a copper plated film formed on a surface of a ruthenium film by controlling the time period after electrolytic processing until the initiation of plating at a constant time using the same apparatus.

Figure 26B:
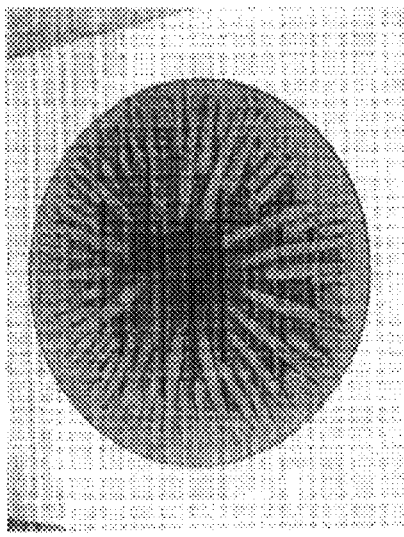
FIG. 26B is a photograph showing the appearance of a substrate surface, as observed when a copper plated film is formed on a surface ruthenium film of the substrate after carrying out only sulfuric acid treatment of the substrate surface.
Figure 26D:
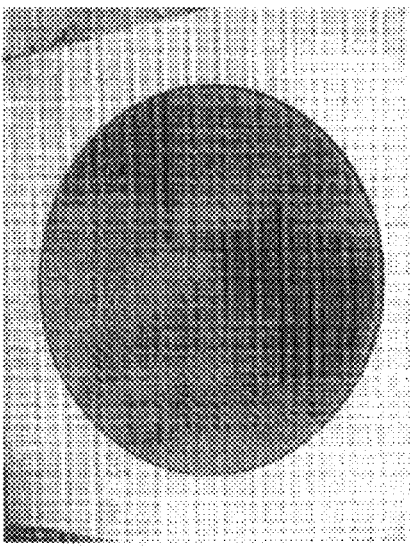
FIG. 26D is a photograph showing the appearance of a substrate surface, as observed when a copper plated film is formed on a surface ruthenium film of the substrate 5 minutes after carrying out sulfuric acid treatment and electrolytic processing using an insoluble anode having a diameter of 15 cm on the substrate surface.
Figure 26A:
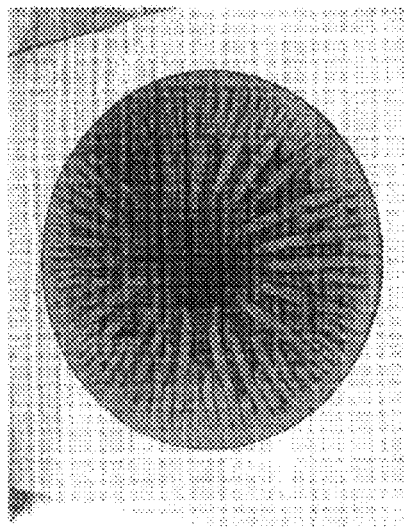
FIG. 26A is a photograph showing the appearance of a substrate surface, as observed when a copper plated film is formed on a surface ruthenium film of the substrate without carrying out treatment with sulfuric acid nor electrolytic processing of the substrate surface before plating.
Figure 26C:
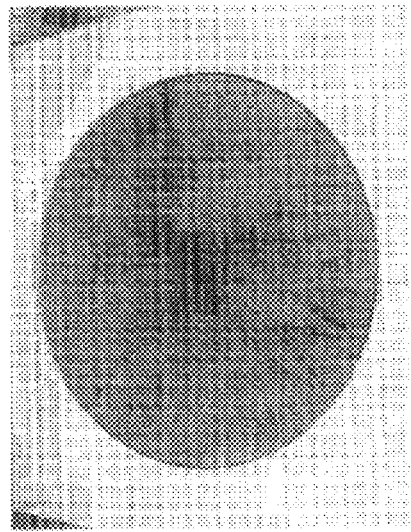
FIG. 26C is a photograph showing the appearance of a substrate surface, as observed when a copper plated film is formed on a surface ruthenium film of the substrate 5 minutes after carrying out sulfuric acid treatment and electrolytic processing using an insoluble anode having a diameter of 29 cm on the substrate surface.

FIG. 26A shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) without carrying out treatment with sulfuric acid nor electrolytic processing of the substrate surface before plating. FIG. 26B shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) after carrying out only sulfuric acid treatment on the substrate surface. FIG. 26C shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) 5 minutes after carrying out sulfuric acid treatment and electrolytic processing using an insoluble anode having a diameter of 29 cm on the substrate surface. FIG. 26D shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) 5 minutes after carrying out sulfuric acid treatment and electrolytic processing using an insoluble anode having a diameter of 15 cm on the substrate surface. Plating was carried out using a copper sulfate plating solution having a copper content of 50 g/L, a sulfuric acid content of 80 g/L and a chlorine content of 50 ppm, and containing three additives called suppressor, accelerator and leveler, and carried out in an electricity amount corresponding to 50-nm thickness of copper plated film.

As can be seen from FIGS. 26A through 26D, a copper plated film is formed only in the peripheral portion of the wafer (substrate) when electrolytic processing is not carried out before plating, whereas the formation of a copper plated film having a uniform thickness over the entire substrate surface becomes possible by carrying out electrolytic processing to remove a ruthenium oxide film from a surface of a ruthenium film.

Figure 27:
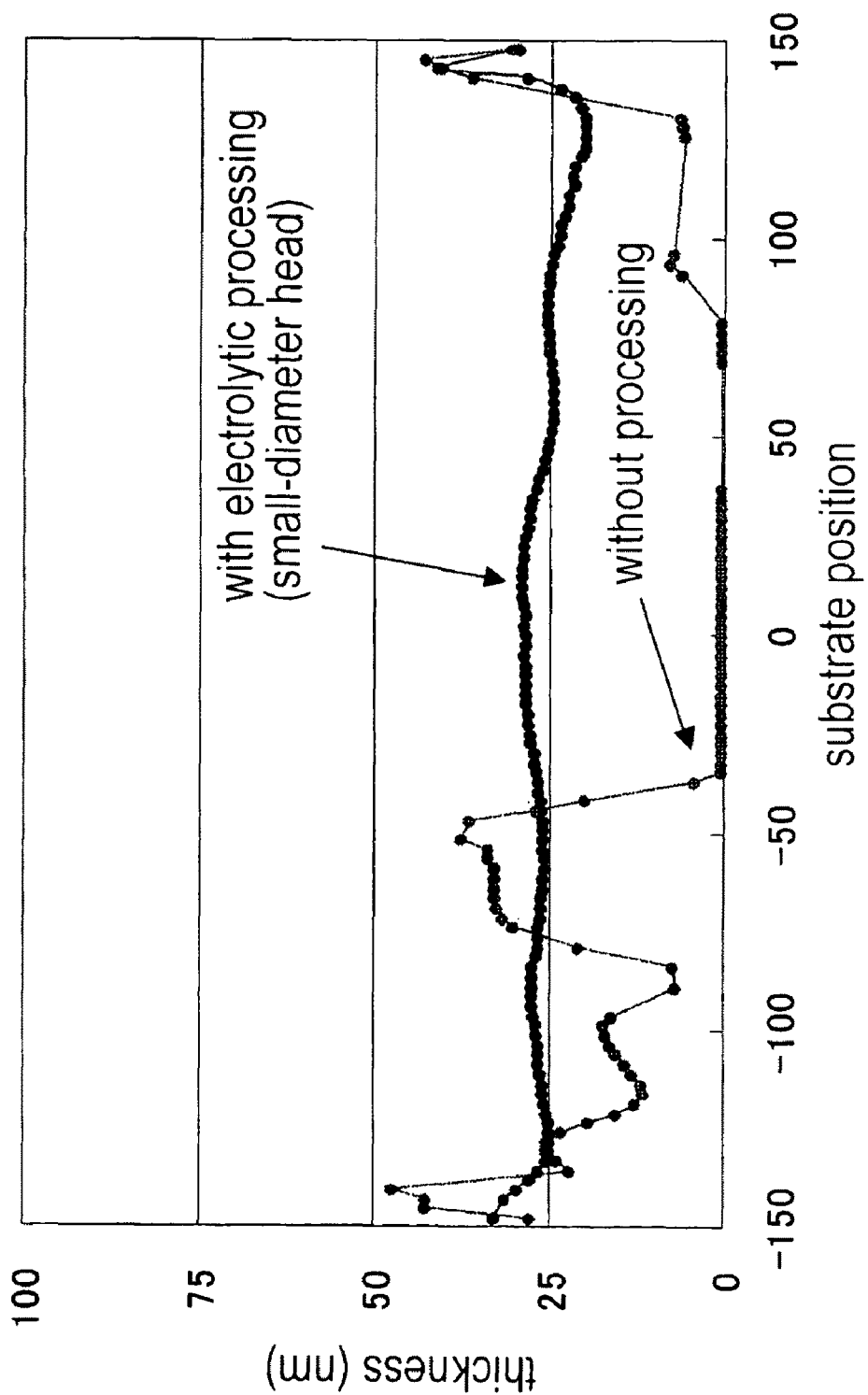
FIG. 27 is a diagram showing a profile of a copper plated film on a substrate (without processing), as observed when the copper plated film is formed on a surface ruthenium film of the substrate without carrying out treatment with sulfuric acid nor electrolytic processing of the substrate surface before plating, and a profile of a copper plated film on a substrate [with electrolytic processing (small-diameter head)], as observed when the copper plated film is formed on a surface ruthenium film of the substrate 5 minutes after carrying out sulfuric acid treatment and electrolytic processing using a small-diameter insoluble anode on the substrate surface.

FIG. 27 shows a profile of the copper plated film on the substrate (without processing), shown in FIG. 26A, the copper plated film having been formed on the surface ruthenium film of the wafer (substrate) without carrying out treatment with sulfuric acid nor electrolytic processing of the substrate surface before plating, and a profile of the copper plated film on the substrate [with electrolytic processing (small-diameter head)], shown in FIG. 26D, the copper plated film having been formed on the surface ruthenium film of the wafer (substrate) 5 minutes after carrying out sulfuric acid treatment and electrolytic processing using the insoluble anode having a diameter of 15 cm on the substrate surface, the profiles being obtained by measuring the substrate surfaces with an Rs meter (four-probe measurement) and converting the measured values with the resistivity of 2.2. As can be seen from FIG. 27, a copper plated film having a uniform thickness can be formed on a surface of a ruthenium film having a sheet resistance of 80 $\Omega/\square$ by carrying out electrolytic processing of the surface of the ruthenium film prior to copper plating, whereas a copper plated film cannot be formed in the central portion of the substrate if electrolytic processing is not carried out.

Figure 28B:
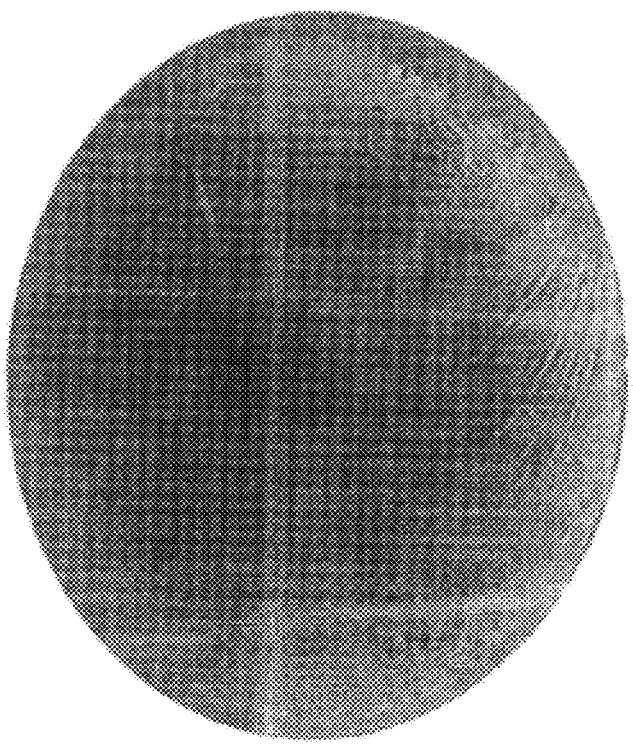
FIG. 28B is a photograph showing the appearance of a substrate, as observed when a copper plated film is formed on a surface ruthenium film of the substrate 120 minutes after carrying out sulfuric acid treatment and electrolytic processing on the substrate surface.
Figure 28A:
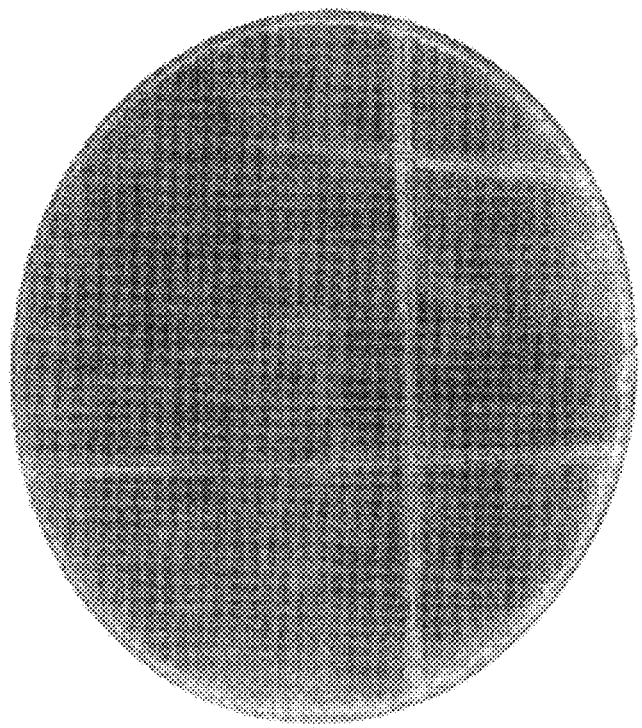
FIG. 28A is a photograph showing the appearance of a substrate surface, as observed when a copper plated film is formed on a surface ruthenium film of the substrate 5 minutes after carrying out sulfuric acid treatment and electrolytic processing on the substrate surface.

FIG. 28A shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) 5 minutes after carrying out sulfuric acid treatment and electrolytic processing on the substrate surface. FIG. 28B shows the appearance of a substrate surface, as observed when a wafer (substrate) having a surface ruthenium film having a sheet resistance of 80 $\Omega/\square$ is prepared, and a copper plated film is formed on the surface of the substrate (ruthenium film) 120 minutes after carrying out sulfuric acid treatment and electrolytic processing on the substrate surface. It will be appreciated that as shown in FIG. 28A, a copper plated film without an abnormal appearance can be formed by carrying out copper plating within 5 minutes after electrolytic processing, whereas as shown in FIG. 28B, abnormal appearance will come out both in the center and in the periphery of the substrate if plating is carried out 120 minutes after electrolytic processing.

Figure 29:
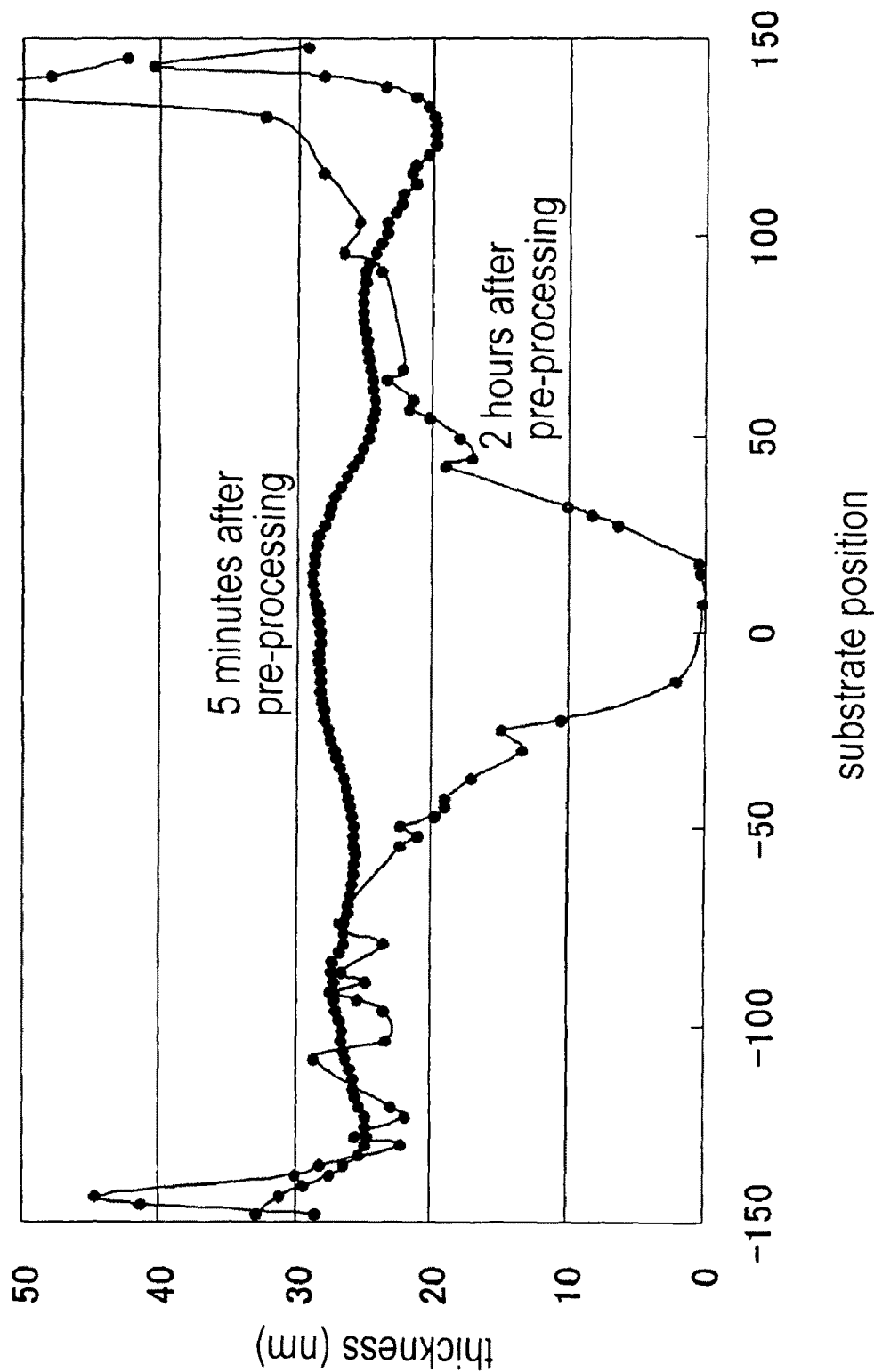
FIG. 29 is a diagram showing a profile of a copper plated film on a substrate, as observed when the copper plated film is formed on a surface ruthenium film of the substrate 5 minutes after carrying out sulfuric acid treatment and electrolytic processing on the substrate surface, and a profile of a copper plated film on a substrate, as observed when the copper plated film is formed on a surface ruthenium film of the substrate 120 minutes after carrying out sulfuric acid treatment and electrolytic processing on the substrate surface.

FIG. 29 shows a profile of the copper plated film on the substrate (5 minutes after processing), shown in FIG. 28A, the copper plated film having been formed 5 minutes after carrying out electrolytic processing of the substrate surface, and a profile of the copper plated film on the substrate (120 minutes after processing), shown in FIG. 28B, the copper plated film having been formed 120 minutes after carrying out electrolytic processing of the substrate surface, the profiles being obtained by measuring the substrate surfaces with an Rs meter (four-probe measurement) and converting the measured values with the resistivity of 2.2. As will be appreciated from FIG. 29, a copper plated film having a uniform thickness can be formed on the surface of a ruthenium film having a sheet resistance of 80 $\Omega/\square$ by carrying out plating within 5 minutes after carrying out electrolytic processing, whereas a copper plated film cannot be formed in the central portion of the substrate if plating is carried out 120 minutes after electrolytic processing.

According to the present invention, electrolytic plating can be carried out in a successive one-by-one manner shortly after removing a passive layer (ruthenium oxide) formed on a surface of a ruthenium film, e.g., having a thickness of not more than 10 nm, and before an oxide film (ruthenium oxide) forms on the surface of the ruthenium film. Furthermore, the terminal effect of the ruthenium film at the time of the removal of the passive layer (ruthenium oxide) formed on the ruthenium film can be reduced. It is therefore expected that the present invention will advantageously be used especially in the manufacturing of the 32-nm or later generation of semiconductor devices.

What is claimed is:

1. A substrate processing apparatus comprising:
a common substrate processing section having a substrate stage for rotatably and vertically-movably holding a substrate with a front surface of the substrate facing upwardly and alternatively forming an electrolytic solution chamber for holding an electrolytic solution and a plating solution chamber for holding a plating solution on the substrate held by the substrate stage;
an electrolytic processing apparatus for electrochemically removing a passive layer formed on a surface of a ruthenium film on the substrate by electrolytic processing in which the ruthenium film is a cathode, said electrolytic processing apparatus comprising said common substrate processing section and an electrolytic processing anode head;
a copper electroplating apparatus for carrying out copper electroplating on the surface of the ruthenium film on the substrate, said copper processing apparatus comprising said common substrate processing section and a plating anode head; and
an apparatus frame housing said electrolytic processing apparatus and said copper electroplating apparatus.

2. The substrate processing apparatus according to claim 1, wherein the electrolytic processing apparatus uses sulfuric acid having a concentration of not more than 10 wt % as an electrolytic solution.

3. The substrate processing apparatus according to claim 1, wherein the electrolytic processing apparatus uses a Na-free acidic aqueous solution having an electric conductivity of not more than 0.4/Ω·cm as an electrolytic solution.

4. The substrate processing apparatus according to claim 3, wherein the electrolytic solution contains at least one of HCl, $H_3PO_4$, $HNO_3$, HF and KCl.

5. The substrate processing apparatus of claim 1, wherein said electrolytic processing anode head comprises an insoluble anode.

6. The substrate processing apparatus of claim 5, wherein said insoluble anode has an area smaller than the area of the substrate.

7. The substrate processing apparatus of claim 1, wherein electrolytic processing apparatus is configured so that said insoluble anode is movable relative and parallel to the substrate.

8. A substrate processing apparatus comprising:
a common substrate processing section having a substrate stage that is arranged to hold a substrate so that it is rotatably and vertically movable with a front surface of the substrate facing upwardly, said common substrate processing section being configured to alternatively form an electrolytic solution chamber for holding an electrolytic solution and a plating solution chamber for holding a plating solution on the substrate held by the substrate stage;
an electrolytic processing anode head that is configured to be combinable with said common processing section so as to form an electrolytic processing apparatus for electrochemically removing a passive layer formed on a surface of a ruthenium film on the substrate by electrolytic processing using the ruthenium film as a cathode;
a plating anode head that is configured to be combinable with said common processing section so as to form a copper electroplating apparatus for carrying out copper electroplating on the surface of the ruthenium film on the substrate; and
an apparatus frame housing said common processing section, said electrolytic processing anode head and said plating anode head.

9. The substrate processing apparatus of claim 8, wherein an electrolytic solution supply section is provided for supplying sulfuric acid having a concentration of not more than 10 wt % as the electrolytic solution.

10. The substrate processing apparatus of claim 8, wherein an electrolytic solution supply section is provided for supplying a Na-free acidic aqueous solution having an electric conductivity of not more than 0.4/Ω·cm as the electrolytic solution.

11. The substrate processing apparatus of claim 8, wherein an electrolytic solution supply section is provided for supplying the electrolytic solution, wherein the electrolytic solution contains at least one of HCl, $H_3PO_4$, $HNO_3$, HF and KCl.

12. The substrate processing apparatus of claim 8, wherein said electrolytic processing anode head comprises an insoluble anode.

13. The substrate processing apparatus of claim 12, wherein said insoluble anode has an area smaller than the area of the substrate.

14. The substrate processing apparatus of claim 8, wherein electrolytic processing apparatus is configured so that said insoluble anode is movable relative and parallel to the substrate.

15. The substrate processing apparatus of claim 8, wherein said electrolytic processing head and said plating anode head are both configured to be movable to and away from said common substrate processing section.

16. The substrate processing apparatus of claim 8, wherein an aspirator is provided to remove plating liquid from said common substrate processing section.

17. The substrate processing apparatus of claim 8, wherein said common substrate processing section comprises substrate chucks, a seal ring and cathode contacts.

* * * * *